(12) United States Patent
Huang et al.

(10) Patent No.: US 10,892,416 B2
(45) Date of Patent: Jan. 12, 2021

(54) SENSITIVE X-RAY AND GAMMA-RAY DETECTORS INCLUDING PEROVSKITE SINGLE CRYSTALS

(71) Applicant: NUtech Ventures, Lincoln, NE (US)

(72) Inventors: Jinsong Huang, Lincoln, NE (US); Haotong Wei, Lincoln, NE (US)

(73) Assignee: NUtech Ventures, Lincoln, NE (US)

( * ) Notice: Subject to any disclaimer, the term of this patent is extended or adjusted under 35 U.S.C. 154(b) by 0 days.

(21) Appl. No.: 16/136,841

(22) Filed: Sep. 20, 2018

(65) Prior Publication Data

US 2019/0140181 A1 May 9, 2019

Related U.S. Application Data

(63) Continuation of application No. PCT/US2017/023437, filed on Mar. 21, 2017.

(Continued)

(51) Int. Cl.
*G01T 1/20* (2006.01)
*H01L 51/00* (2006.01)
(Continued)

(52) U.S. Cl.
CPC .......... *H01L 51/0032* (2013.01); *G01T 1/24* (2013.01); *H01L 31/0224* (2013.01);
(Continued)

(58) Field of Classification Search
CPC .......... H01L 51/0032; H01L 51/4213; H01L 51/4246; H01L 31/0224; H01L 31/032;
(Continued)

(56) References Cited

U.S. PATENT DOCUMENTS 7,612,342 B1 * 11/2009 Nagarkar ............. C09K 11/616
250/361 R
7,732,067 B2 6/2010 Zurbuchen
(Continued)

FOREIGN PATENT DOCUMENTS

WO WO 2013/171518 A1 11/2013
WO WO 2013/171520 A1 11/2013
(Continued)

OTHER PUBLICATIONS

Fyodorov et al., "A broad-range Yttrium Aluminum Perovskite-based dosimeter," 1995, Proceedings of 1994 IEEE Nuclear Science Symposium, vol. 2, pp. 978-981 (Year: 1995).*

(Continued)

*Primary Examiner* — Kiho Kim
(74) *Attorney, Agent, or Firm* — Leydig, Voit & Mayer, Ltd.; Gerald T. Gray

(57) ABSTRACT

Perovskite single crystal X-ray and gamma-ray radiation detector devices include an X-ray and gamma-ray wavelength responsive active layer including a perovskite single crystal. The perovskite single crystal is a perovskite single crystal having a structure of $ABX_3$, wherein A is methylammonium ($CH_3NH_3+$), $C_s+$, formamidinum ($H_2NCHNH_2+$), or $Rb^+$ or a mixture thereof, B is $Pb^{2+}$ which can be partially or completely replaced by other ions including $Bi^{3+}$, $Sb^{3+}$, $Sn^{2+}$ or a mixture thereof, and X is a halide anion, thiocyanate (SCN−) or a mixture thereof.

14 Claims, 20 Drawing Sheets

Related U.S. Application Data

(60) Provisional application No. 62/311,291, filed on Mar. 21, 2016.

(51) Int. Cl.

| | |
|---|---|
| *G01T 1/24* | (2006.01) |
| *H01L 51/42* | (2006.01) |
| *H01L 31/0224* | (2006.01) |
| *H01L 31/032* | (2006.01) |
| *H01L 31/036* | (2006.01) |
| *H01L 31/08* | (2006.01) |
| *H01L 31/18* | (2006.01) |
| *H01L 51/44* | (2006.01) |

(52) U.S. Cl.
CPC .......... *H01L 31/032* (2013.01); *H01L 31/036* (2013.01); *H01L 31/085* (2013.01); *H01L 31/18* (2013.01); *H01L 51/4213* (2013.01); *H01L 51/4246* (2013.01); *H01L 51/441* (2013.01); *Y02E 10/549* (2013.01)

(58) Field of Classification Search
CPC ..... H01L 31/036; H01L 31/085; H01L 31/18; H01L 51/441; G01T 1/24; Y02E 10/549
See application file for complete search history.

(56) References Cited

U.S. PATENT DOCUMENTS

| | | | |
|---|---|---|---|
| 9,082,992 | B2 | 7/2015 | Guo et al. |
| 9,391,287 | B1 | 7/2016 | Huang et al. |
| 9,812,660 | B2 | 11/2017 | Huang et al. |
| 2003/0038299 | A1* | 2/2003 | Demkov .............. C30B 25/18 257/190 |
| 2015/0136232 | A1* | 5/2015 | Snaith ................ H01L 51/0077 136/263 |
| 2015/0200377 | A1 | 7/2015 | Etgar et al. |
| 2015/0249170 | A1 | 9/2015 | Snaith et al. |

FOREIGN PATENT DOCUMENTS

| | | |
|---|---|---|
| WO | WO 2014/210040 A1 | 12/2014 |
| WO | WO 2015/183563 A1 | 12/2015 |

OTHER PUBLICATIONS

Luo, Shigiang, et al., "Recent progress in organic-inorganic halide perovskite solar cells: mechanisms and material design," J. Mater. Chem. A, 2015, 3, 8992-9010, Royal Society of Chemistry.

Shi, Dong, et al., "Low trap-state density and long carrier diffusion in organolead trihalide perovskite single crystals," sciencemag.org, Jan. 30, 2015, vol. 347, issue 6221, pp. 519-522.

Yue, Yougeng., et al., "Selective Deposition of Insulating Metal Oxide in Perovskite Solar Cells with Enhanced Device Performance," ChemSusChem 2015, 8, 2625-2629, Wiley-VCH Verlag GmbH & Co. KGaA, Weinheim.

Bai, Sai, et al., "Ethanedithiol Treatment of Solution-Processed ZnO Thin Films: Controlling the Intragap States of Electron Transporting Interlayers for Efficient and Stable Inverted Organic Photovoltaics," Advanced Energy Materials, (5), 1401606 (2015), Wiley-VCH Verlag.

Wei, Haotong, et al., "Sensitive X-ray detectors made of methylammonium lead tribromide perovskite single crystals," Nature Photonics vol. 10, Mar. 2016, DOI: 10.1038/nphoton.2016.41, Macmillan Publishers Limited.

Yin, Wan-Jian, et al., "Origin of High Electronic Quality in Structurally Disordered $CH_3NH_3PbI_3$ and the Passivation Effect of Cl and O at Grain Boundaries," Adv. Electron. Mater. 2015, 1, 1500044 (1-8), Wiley-VCH Verlag GmbH & Co., KGaA, Weinheim.

Sergii Yakunin et al., "Detection of X-ray photons by solution-processed organic-inorganic perovskites." Nature Photonics, May 2015.

Written Opinion of the International Searching Authority, dated Jun. 9, 2017, in Application No. PCT/US2017/023437.

International Search Report, dated Jun. 9, 2017, in Application No. PCT/US2017/023437.

Kim, H., et al., "Lead Iodide Perovskite Sensitized All-Solid-State Submicron Thin Film Mesoscopic Solar Cell With Efficiency Exceeing 9%," Scientific Reports 2, 591; DOI:10.1038/srep00591 (2012).

Sergii Yakunin et al., "Detection of X-ray photons by solution-processed lead halide perovskites." Institute of Semiconductor and Solid State Physics, University Linz, Altenbergstrabe 69, Linz 4040 Austria, pp. 1-18, published in Nature Photonics, May 2015.

\* cited by examiner

FIG. 1A
FIG. 1B
FIG. 1C
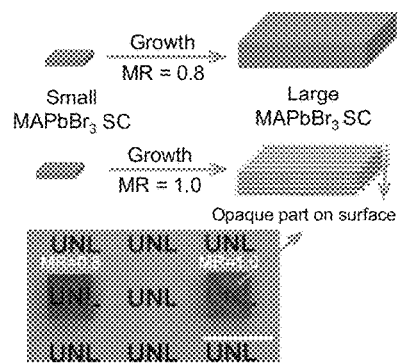
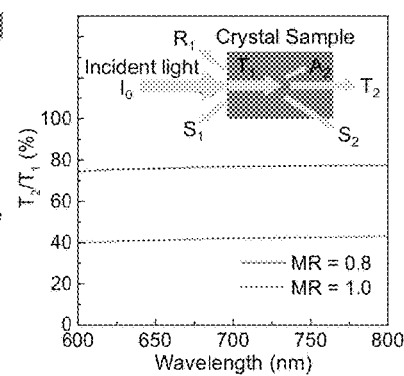
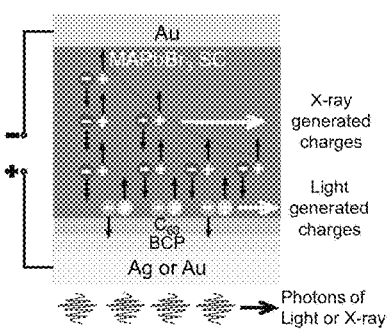
FIG. 1D
FIG. 1E
FIG. 1F
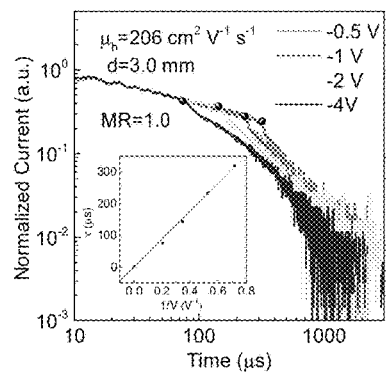
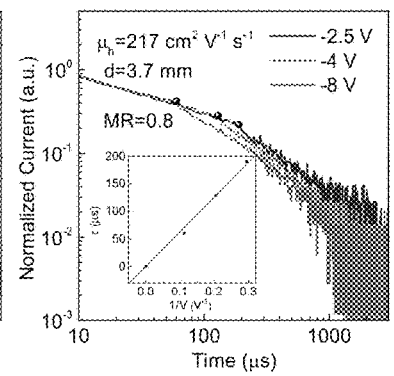
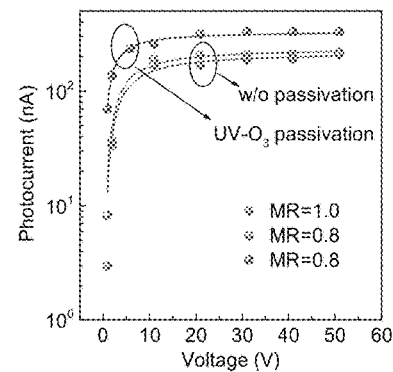

FIG. 2A
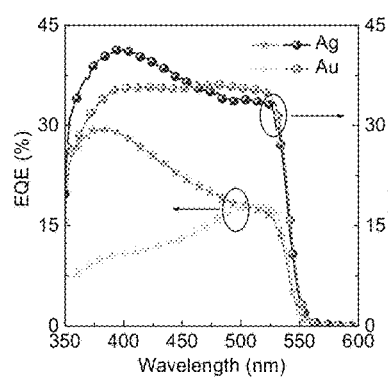
FIG. 2B
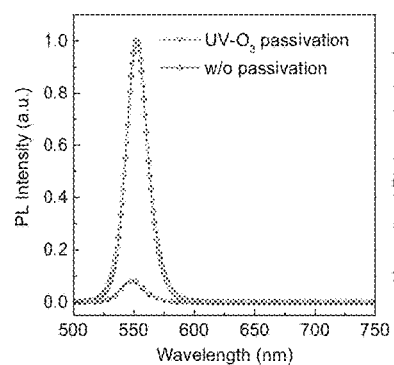
FIG. 2C
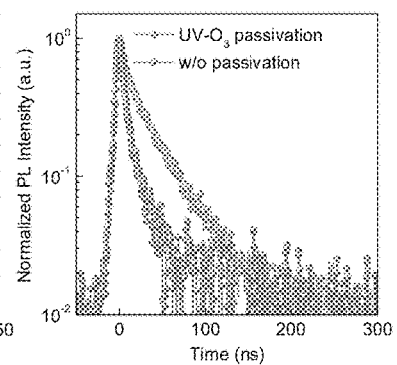
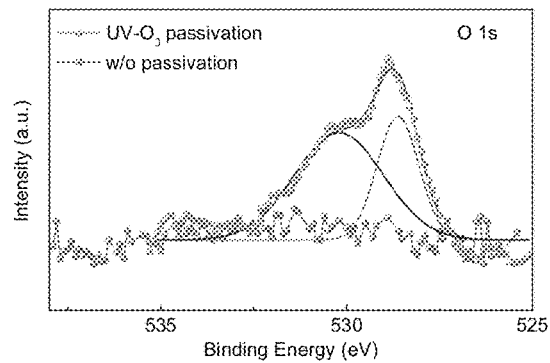
FIG. 2D
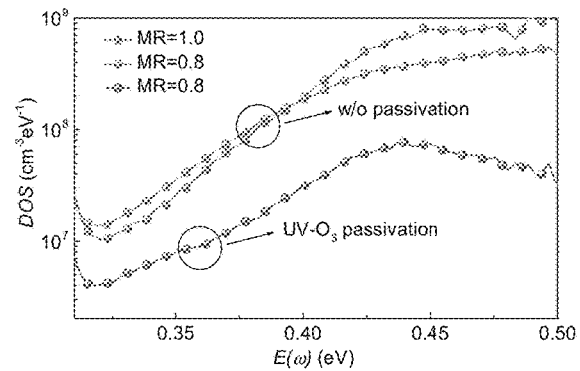
FIG. 2E FIG. 7A
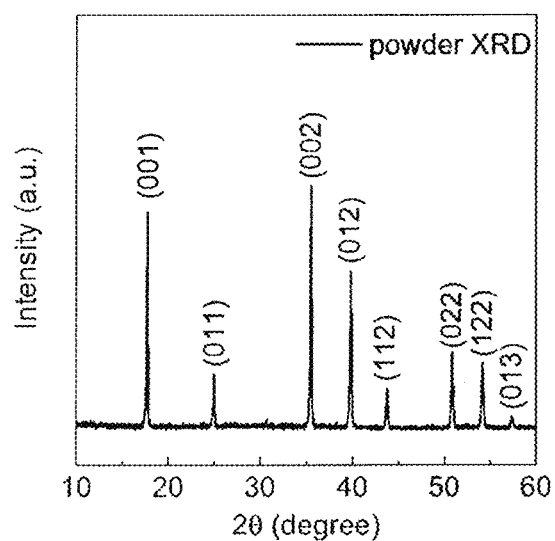
FIG. 7B
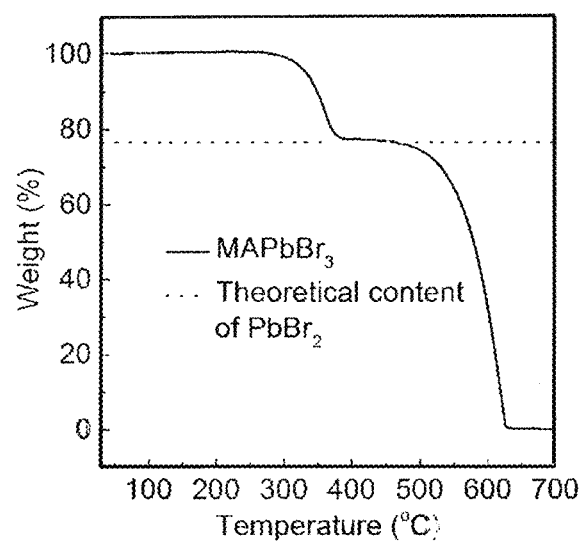
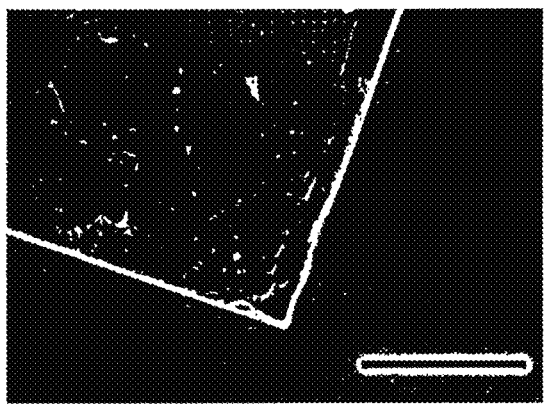
FIG. 7C
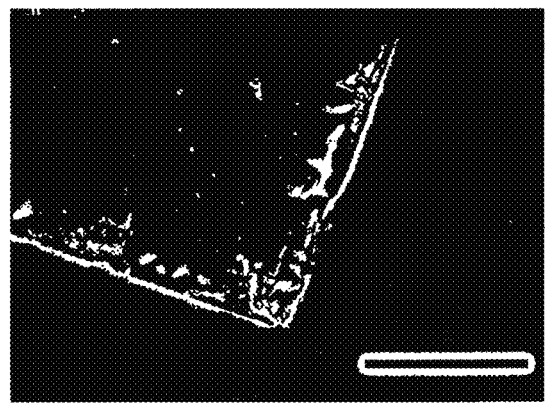
FIG. 7D FIG. 8
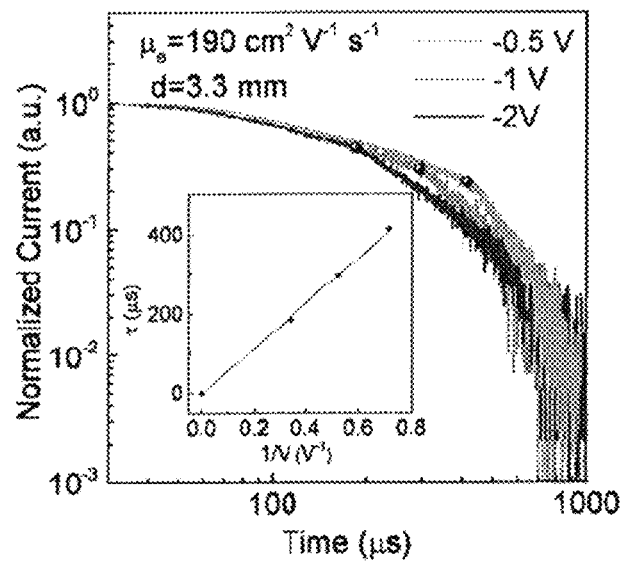
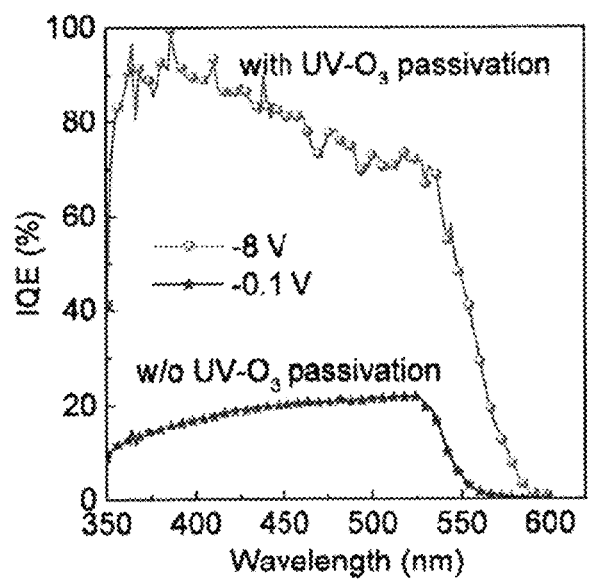
FIG. 9

FIG. 10
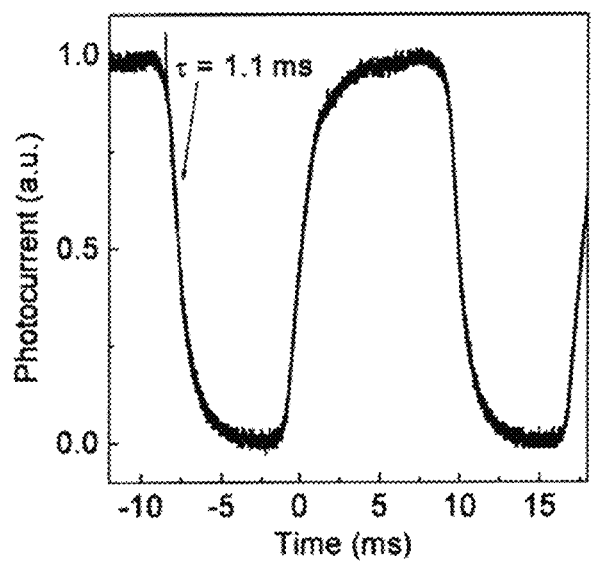
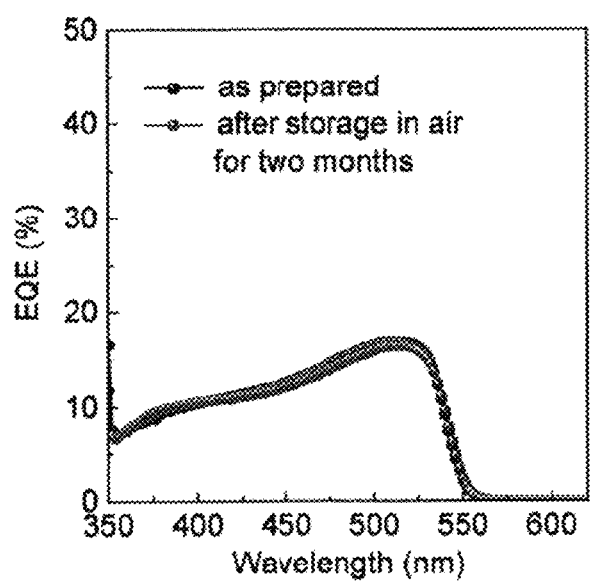
FIG. 11

SENSITIVE X-RAY AND GAMMA-RAY DETECTORS INCLUDING PEROVSKITE SINGLE CRYSTALS

CROSS REFERENCES

The present Application for Patent claims priority to International Patent Application No. PCT/US2017/023437 by Huang et al., entitled "Sensitive X-Ray and Gamma-Ray Detectors Including Perovskite Single Crystals," filed Mar. 21, 2017; and to U.S. Provisional Patent Application No. 62/311,291 by Huang et al., entitled "Sensitive X-Ray Detector Devices Including Organolead Trihalide Perovskite Single Crystals," filed Mar. 21, 2016; each of which is incorporated herein by reference in its entirety.

STATEMENT REGARDING FEDERALLY SPONSORED RESEARCH AND DEVELOPMENT

This invention was made with Government support under Grant Number HDTRA1-14-1-0030 awarded by the Defense Threat Reduction Agency. The Government has certain rights in this invention.

BACKGROUND

Sensitive and low-cost X-ray detectors have been actively pursued for broad applications in security, defense, medical imaging, industrial material inspections, nuclear power stations, and scientific research. In these applications, high sensitivity is important as it allows for detecting a weaker X-ray dose rate and a smaller dose. High-dose X-rays are known to be extremely harmful to the human body, and impose an increased lifetime cancer risk, especially to children, from X-ray inspections such as X-ray computed tomography. Therefore, an enhanced sensitivity of the X-ray detectors can largely reduce such risk by minimizing the X-ray dose needed during routine medical inspections.

The operation of semiconductor-based X-ray detectors is similar to that of visible light photodetectors in that a high signal-to-noise ratio is needed for high sensitivity, while the main differences are the photon energy absorbing process, charge generation process, and the associated charge extraction process. Due to the much stronger penetration capability of X-ray photons, a much thicker active layer is needed to stop and absorb X-rays, and charges are generated across the entire thickness of a semiconductor crystal. In order to collect these charges, a large charge carrier mobility ($\mu$) and charge carrier lifetime ($\tau$) product, or mu-tau ($\mu\tau$) product, is needed, because $\mu\tau$ determines the average carrier drift distance per unit electric field, and thus the charge collection efficiency at a given electric field. To this end, many photovoltaic semiconductors, including Si, Cd(Zn)Te, Ge, etc., have been studied for radiation detection. Nevertheless, the stopping power (or attenuation coefficient $\alpha$) of a material to X-rays is very sensitive to the atomic number (Z) with a relationship of ($\alpha \propto Z^4/E^3$), where E is the X-ray photon energy. Although thick silicon single crystalline detectors have been commercialized for X-ray detection due to their very large $\mu\tau$ product, their sensitivity remains low due to the small Z of Si.

Accordingly there is a need for improved X-ray detectors having improved sensitivity.

SUMMARY

The present disclosure provides improved X-ray and gamma-ray detector devices having improved sensitivity. The devices and materials of the present embodiments are useful for detecting radiation having an energy in a range of from about 500 eV or smaller to about 5 MeV or larger. The devices and materials are also useful for detecting charged particles such as alpha particles.

Perovskites have emerged as a new generation of photovoltaic material and exhibit high power conversion efficiency of around 20% or greater. Perovskites are also attractive for radiation detection because of their high Z elements including Pb, Cs, Rb, Bi, Sn, Sb, I or Br. Initial applications of methylammonium lead triiodide (MAPbI$_3$) perovskite films with a thickness of 60 µm in photoconductive devices have been demonstrated to detect 8 keV soft X-rays. A sensitivity of 1.1 µC Gy$_{air}^{-1}$ cm$^{-2}$ for the perovskite photovoltaic device with a thickness of 600 nm was derived from the slope of the current output versus x-ray dose. Nevertheless, the polycrystalline films formed by a spray coating method had small µ$\tau$ product of $2\times10^{-7}$ cm$^2$ V$^{-1}$, which is 5 orders of magnitude smaller than that of the state-of-the-art X-ray detector materials such as CdZnTe (CZT). Another limitation of applying thin film perovskite for X-ray detection is the incomplete attenuation of X-ray photons. One simulation showed a thickness of 1.0 mm for MAPbI$_3$, 2.0 mm for MAPbBr$_3$ or 72.0 mm for Si is needed to stop 98% of X-ray photons with an energy of 50 keV.

Recent studies of perovskite single crystals (SCs) revealed dramatically enhanced carrier recombination lifetime and carrier mobility once the grain boundaries were removed_due to the 10$^4$-10$^6$ smaller trap density. The perovskite SCs offer the advantages of high stopping power, low trap density and high charge collection efficiency, which enable a high sensitivity in both soft and hard X-ray detection as well as gamma-ray detection.

According to an embodiment, an X-ray detector includes a perovskite single crystal (SC) photoactive layer with anode and cathode layers disposed on the same side or opposite sides of the SC. According to a specific embodiment, an X-ray detector includes a MAPbBr$_3$ SC photoactive layer with anode and cathode layers disposed on the same side or opposite sides of the SC. A MAPbBr$_3$ SC is particularly advantageous because it has a cubic crystal shape that allows for easy electrode and device fabrication. According to a specific embodiment, an X-ray detector includes a MAPbBr$_{3-x}$Cl$_x$, SC photoactive layer with anode and cathode layers disposed on the same side or opposite sides of the SC, wherein x is a fractional number between 0 and 3, inclusive.

According to an embodiment, a perovskite single crystal X-ray and gamma-ray radiation detector device is provided that typically includes an X-ray and gamma-ray wavelength responsive active layer including a perovskite single crystal, a first electrode disposed on a first surface of the perovskite single crystal, and a second electrode disposed on the first surface (e.g., whereby charge flows laterally in the plane defined by the perovskite crystal) or on a second surface of the perovskite single crystal opposite the first surface(e.g., whereby charge flows vertically across the perovskite crystal between the first and second surfaces). In certain aspects, a thickness of the perovskite single crystal is between about 0.01 mm and about 100 mm. In certain aspects, a thickness of the perovskite single crystal is between about 2 mm and about 3 mm. In certain aspects, the organolead trihalide perovskite single crystal is a perovskite single crystal having a structure of ABX$_3$, wherein A is methylammonium (CH$_3$NH$_3$+), Cs+, or formamidinum (H$_2$NCHNH$_2$+), or Rb$^+$ or a mixture thereof, B is Pb$^{2+}$ which can be partially or completely replaced by other ions including Bi$^{3+}$, Sb$^{3+}$, Sn$^{2+}$ or a mixture thereof, and X is a halide anion, thiocyanate (SCN−) or a mixture thereof. In certain aspects, A, B and X ions comprise any ions whose ionic radius are suitable to form a stable perovskite structure with a tolerance factor between about 0.5 and about 1.5, where the tolerance factor of perovskite can be calculated by $$t = \frac{r_A + r_X}{\sqrt{2}\,(r_B + r_X)},$$

where $r_A$, $r_B$ and $r_X$ are the ionic radius of the A, B and X ions, respectively. In certain aspects, the perovskite single crystal includes a MAPbBr$_3$ single crystal, and wherein the MAPbBr$_3$ single crystal is synthesized with a ratio of PbBr$_2$:MABr of from about 0.6 to about 1.2 in a precursor solution. In certain aspects, the precursor solution ratio of PbBr$_2$:MABr is around 0.8. In certain aspects, the perovskite single crystal has a structure of ABI$_{3-x-y-z}$Br$_x$Cl$_y$SCN$_z$, where A is methylammonium (CH$_3$NH$_3^+$), Cs$^+$, formamidinum (H$_2$NCHNH$_2^+$), or Rb$^+$ or a mixture thereof, B is Pb$^{2+}$ which can be partially or completely replaced by other ions including Bi$^{3+}$, Sb$^{3+}$, Sn$^{2+}$ or their mixture and wherein x, y and z are a fractional numbers between, and including, 0 and 3. In certain aspects, the first and second electrodes each comprise gold silver, aluminum, chromium, or copper or other conductive material.

According to another embodiment, a method of fabricating a perovskite single crystal device structure is provided. The method typically includes forming a perovskite single crystal structure, and passivating a surface of the perovskite single crystal structure to reduce a density of surface defects in the surface. In certain aspects, passivating includes bonding the surface defects of the A, B and/or X ions with molecules. In certain aspects, passivating includes oxidizing a surface. In certain aspects, passivating includes performing a UV-O$_3$ passivation treatment on the surface. In certain aspects, the perovskite single crystal has a structure of ABX$_3$ or ABI$_{3-x-y-z}$Br$_x$Cl$_y$SCN$_z$, wherein A is methylammonium (CH$_3$NH$_3^+$), Cs$^+$, formamidinum (H$_2$NCHNH$_2^+$), or Rb$^+$ or a mixture thereof, B is Pb$^{2+}$ which can be partially or completely replaced by other ions including Bi$^{3+}$, Sb$^{3+}$, Sn$^{2+}$ or their mixture and x, y and z are fractional numbers between, and including, 0 and 3. In certain aspects, A, B and X ions comprise any ions having an ionic radius suitable to form a stable perovskite structure with a tolerance factor between about 0.5 and about 1.5. The tolerance factor of perovskite can be calculated by $$t = \frac{r_A + r_X}{\sqrt{2}\,(r_B + r_X)},$$

where $r_A$, $r_B$ and $r_X$ are the ionic radius of the A, B and X ions, respectively. In certain aspects, a thickness of the perovskite single crystal structure is between about 0.01 mm and about 100 mm. In certain aspects, the perovskite single crystal structure includes a MAPbBr$_3$ single crystal, and wherein forming includes synthesizing the MAPbBr$_3$ single crystal in a precursor solution with a ratio of PbBr$_2$:MABr of from about 0.6 to about 1.2. In certain aspects, the precursor solution ratio of PbBr$_2$:MABr is around 0.8

According to yet another embodiment, a method of fabricating a perovskite single crystal device structure is provided. The method typically includes forming a perovskite single crystal structure, and passivating a surface of the perovskite single crystal structure to reduce a density of surface defects in the surface including oxidizing or depositing some molecules that can bond with A, B and X ions-related defects. In certain aspects, oxidizing includes performing a UV-O$_3$ passivation treatment on a surface. In certain aspects, the perovskite single crystal has a structure of ABX$_3$ or ABI$_{3-x-y-z}$Br$_x$Cl$_y$SCN$_z$, wherein A is methylammonium (CH$_3$NH$_3^+$), Cs$^+$, formamidinum (H$_2$NCHNH$_2^+$), Rb$^+$ or a mixture thereof, B is Pb$^{2+}$ which can be partially or completely replaced by other ions including Bi$^{3+}$, Sb$^{3+}$, Sn$^{2+}$ or their mixture and x, y and z are fractional numbers between, and including, 0 and 3. In certain aspects, A, B and X ions comprise any ions whose ionic radius are suitable to form a stable perovskite structure with tolerance factor between about 0.5 and about 1.5, where the tolerance factor of perovskite can be calculated by $$t = \frac{r_A + r_X}{\sqrt{2}\,(r_B + r_X)},$$

where $r_A$, $r_B$ and $r_X$ are the ionic radius of the A, B and X ions, respectively. In certain aspects, a thickness of the perovskite single crystal structure is between about 0.01 mm and about 100 mm. In certain aspects, the perovskite single crystal structure includes a MAPbBr$_3$ single crystal, and wherein forming includes synthesizing the MAPbBr$_3$ single crystal in a precursor solution with a ratio of PbBr$_2$:MABr of from about 0.6 to about 1.2. In certain aspects, the precursor solution ratio of PbBr$_2$:MABr is around 0.8

In certain embodiments, arrays of detector elements as disclosed herein are formed, e.g., with appropriate readout electrode array patterns defining detector pixels of a detector device.

Reference to the remaining portions of the specification, including the drawings and claims, will realize other features and advantages of the present invention. Further features and advantages of the present invention, as well as the structure and operation of various embodiments of the present invention, are described in detail below with respect to the accompanying drawings. In the drawings, like reference numbers indicate identical or functionally similar elements.

BRIEF DESCRIPTION OF THE SEVERAL VIEWS OF THE DRAWING(S)

The detailed description is described with reference to the accompanying figures. The use of the same reference numbers in different instances in the description and the figures may indicate similar or identical items.

FIG. 1A shows a scheme and a photo of MAPbBr$_3$ SC with different molar ratios (MRs); the thicknesses of both the SCs in the photo are about 2 mm. Scale bar, 10 m.

FIG. 1B shows absolute transparency of 2 mm thick SCs synthesized with different precursor MRs; inset is the geometry of light propagation process.

FIG. 1C shows a device structure of a SC radiation detector according to an embodiment; the charge generation regions locate close to the surface for visible light excitation, and internal part of SC under X-ray, respectively.

FIG. 1D and FIG. 1E show the normalized transient current curves of the MAPbBr$_3$ SC devices with different MRs under various biases; both insets show the charge transit time versus the reciprocal of bias; the solid line is a linear fit to the data.

FIG. 1F shows photoconductivity of MAPbBr$_3$ SC devices with different MRs and surface treatments—fitting lines are also shown.

FIG. 2A shows EQE and IQE of the MAPbBr$_3$ SC devices with different cathode electrodes after UV-O$_3$ passivation.

FIG. 2B shows PL spectra of a MAPbBr$_3$ SC in vacuum before and after UV-O$_3$ treatment.

FIG. 2C shows PL lifetime of the MAPbBr$_3$ SC in vacuum before and after UV-O$_3$ treatment.

FIG. 2D shows XPS spectra of the MAPbBr$_3$ thin film for O 1 s before and after UV-O$_3$ passivation.

FIG. 2E shows trap density of states of the MAPbBr$_3$ SC devices with different MRs, before and after UV-O$_3$ treatment.

FIG. 7A shows powder XRD of MAPbBr$_3$ SC.

FIG. 7B shows a TGA curve of MAPbBr$_3$ SC shows the equimolar composition of PbBr$_2$ and MABr; MAPbBr$_3$ SC begins to decompose at around 322° C., and left PbBr$_2$ mass is in accordance with the theoretical value.

FIG. 7C and FIG. 7D show optical microscopy images of MAPbBr$_3$ SC in normal transmittance mode, and polarized transmittance mode, respectively; both of the scale bars, 1 mm.

FIG. 8 shows the normalized transient current curves of the MAPbBr$_3$ SC device under various biases; inset shows the charge transit time versus the reciprocal of bias to extract the electrons mobility; the solid line is a linear fit to the data.

FIG. 9 shows IQE of MAPbBr$_3$ SC device w/o UV-O$_3$ passivation under −0.1 V, and IQE of MAPbBr$_3$ SC device with UV-O$_3$ passivation under −8 V.

FIG. 10 shows the temporal response of the MAPbBr$_3$-MR0.8 SC device with thickness of 2.6 mm.

FIG. 11 shows EQE spectrum of an X-ray detector before and after storage for two months in air.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Various embodiments of the present disclosure provide radiation sensitive materials, and devices incorporating the same. In particular, certain embodiments provide X-ray and gamma-ray wavelength range photoactive perovskite materials, and devices incorporating the same.

Figure 1G:
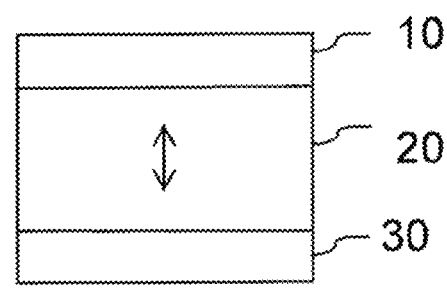
FIG. 1G illustrates a side cross-sectional view of a "vertical" device structure according to an embodiment.
Figure 1H:
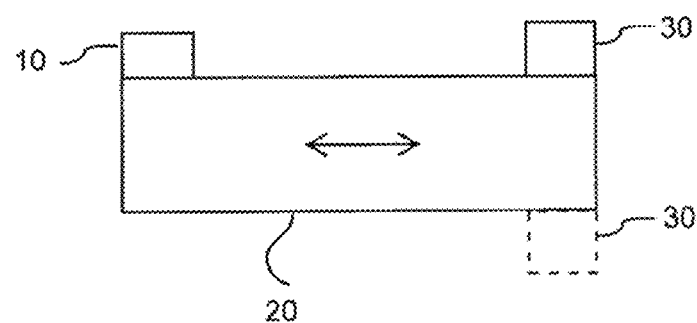
FIG. 1H illustrates a side cross-sectional view of a "lateral" device structure according to an embodiment.

In certain embodiments, photoactive devices have a structure of electrode (anode or cathode) 10/perovskite-SC 20/electrode (cathode or anode) 30, where the two electrodes (10, 30) are on opposite sides of the perovskite-SC as shown in FIG. 1G. In these embodiments, the perovskite-SC is the photoactive layer and responsive to a wide range of wavelengths, including for example x-ray wavelengths, and photoresponsive charges (and holes) generated in the photoactive layer generally migrate to the electrodes in a vertical fashion as shown by the arrow in FIG. 1G, and also in FIG. 1C as a specific example. In other embodiments, photoactive devices have a structure of electrode (anode or cathode) 10/perovskite-SC 20/electrode (cathode or anode) 30, where the two electrodes (10, 30) are on the same side of the perovskite-SC as shown in FIG. 1H. In these embodiments, the perovskite-SC is the photoactive layer and responsive to a wide range of wavelengths, including for example x-ray wavelengths, and photoresponsive charges (and holes) generated in the photoactive layer generally migrate to the electrodes in a lateral fashion along the plane defined by the perovskite-SC as shown by the arrow in FIG. 1H. A lateral structure may also be formed by positioning electrode 30 on an opposite side of the perovskite-SC 30 from electrode 10, but displaced laterally as shown by the dotted line in FIG. 1H.

In certain embodiments, the OTP-SC includes a perovskite single crystal having a structure of $ABX_3$, wherein A is methylammonium ($CH_3NH_3^+$), $Cs^+$, formamidinum ($H_2NCHNH_2^+$), $Rb^+$ or a mixture thereof, B is $Pb^{2+}$ which can be partially or completely replaced by other ions such as $Bi^{3+}$, $Sb^{3+}$, $Sn^{2+}$ or a mixture thereof, and x, y and z are fractional numbers between, and including, 0 and 3. The A, B and X ions are not limited to those above mentioned ions, but rather may comprise any ions whose ionic radius are suitable to form a stable perovskite structure with tolerance factor between about 0.5 and about 1.5.

The tolerance factor of perovskite can be calculated by $$t = \frac{r_A + r_X}{\sqrt{2}\,(r_B + r_X)},$$

where $r_A$, $r_B$ and $r_X$ are the ionic radius of the A, B and X ions. Methylammonium ($CH_3NH_3+$) may also be referred to herein as "MA". One specific example is or $MAPbBr_3$. In other embodiments, the perovskite-SC includes a perovskite single crystal having a structure of $MAPbBr_{3-x}Cl_x$, wherein x is a fractional number between, and including, 0 and 3. Other material layers such as hole accepting/transport material layers and/or electron accepting/transport material layers may be included between the electrode layers and the active layer (e.g., perovskite-SC) as desired.

Useful anode materials include any transparent or semi-transparent conductive or semi-conductive material, such as metals or metal films, conductive polymers, carbon nanotubes, graphene, organic or inorganic transparent conducting films (TCFs), transparent conducting oxides (TCOs), etc. Specific examples of anode materials include gold (Au), silver (Ag), titanium (Ti), indium tin oxide (ITO), copper (Cu), carbon nanotubes, graphene, aluminum (Al), chromium (Cr), lead (Pb), platinum (Pt), and PEDOT:PSS. The dimensions of an anode layer may be varied depending on the material used. For example, the anode may have a thickness of between about 10 nm and about 100 nm or 100 nm or greater (e.g., less than about 200 nm, or less than about 1000 nm), depending on the properties of the materials used, such as the transparency and the conductivity. Known deposition or thermal evaporation techniques may be used to form the anode layer.

Useful cathode materials include the same materials as may be used for the anode, although the cathode need not be transparent. Specific examples of cathode materials include gallium (Ga), gold (Au), silver (Ag), tin titanium (Ti), indium tin oxide (ITO), indium (In), copper (Cu), carbon nanotubes, graphene, aluminum (Al), chromium (Cr), lead (Pb), platinum (Pt), and PEDOT:PSS. The dimensions of the cathode layer may be varied depending on the material used. For example, the cathode may have a thickness of between about 10 nm and about 100 nm or greater (e.g., less than about 200 nm, or less than about 1000 nm, or less than about 1 μm, or less than about 1 mm, or less than about 1 cm), depending on the conductivity of the materials used. Known deposition or thermal evaporation techniques may be used to form the cathode layer. A substrate, upon which an anode layer or a cathode layer may be formed, may be used to provide structural stability and may include glass, polymer, semiconductor materials, etc.

Non-Stoichiometry Precursor Solution for Improved μτ Product of the SCs

Figure 5A:
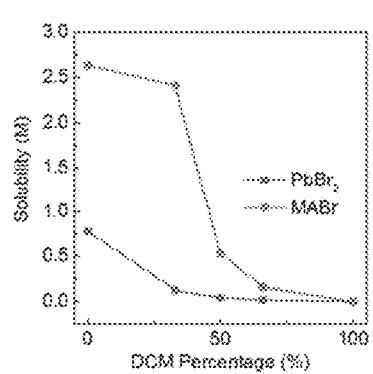
FIG. 5A shows solubility of PbBr$_2$ and MABr in DMF/DCM mixture solvents, respectively.
Figure 5B:
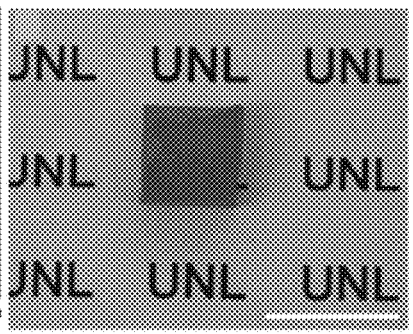
FIG. 5B and FIG. 5C show photo images of big MAPbBr$_3$-MR1.0 SCs, before and after DMF etching, respectively; the SC becomes more transparent after etching the surface part by DMF. Both of the scale bars, 10 mm.
Figure 5C:
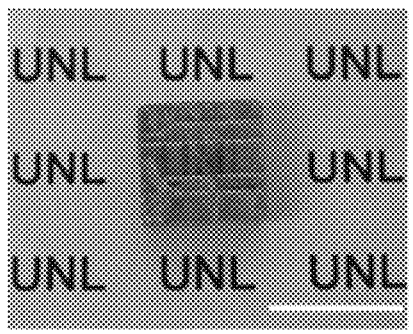
Figure 6A:
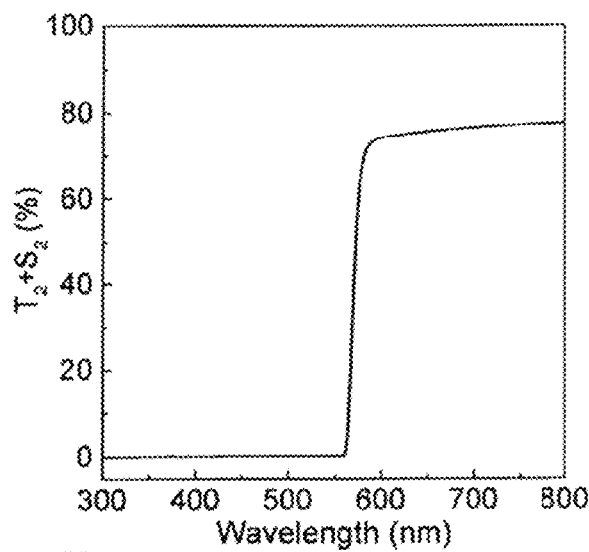
FIG. 6A shows absolute transmittance and scattering of MAPbBr$_3$ SC measured by placing the crystal inside the light in-bound port.
Figure 6B:
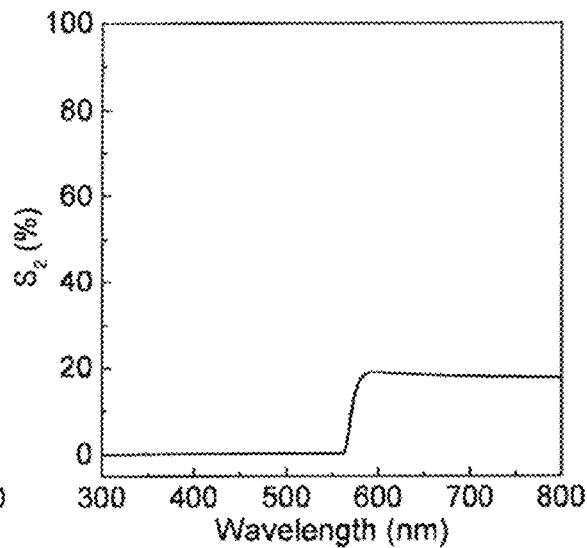
FIG. 6B shows absolute scattering of MAPbBr$_3$ SC by only recording the scattered light.
Figure 6C:
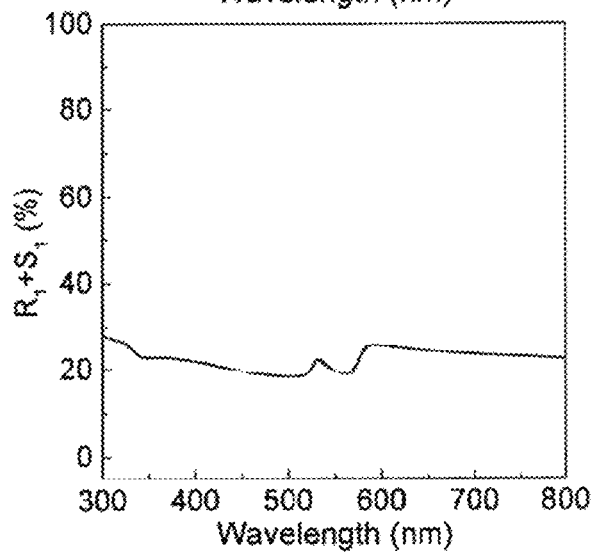
FIG. 6C shows absolute front reflectance and front scattering of MAPbBr$_3$ SC.
Figure 6D:
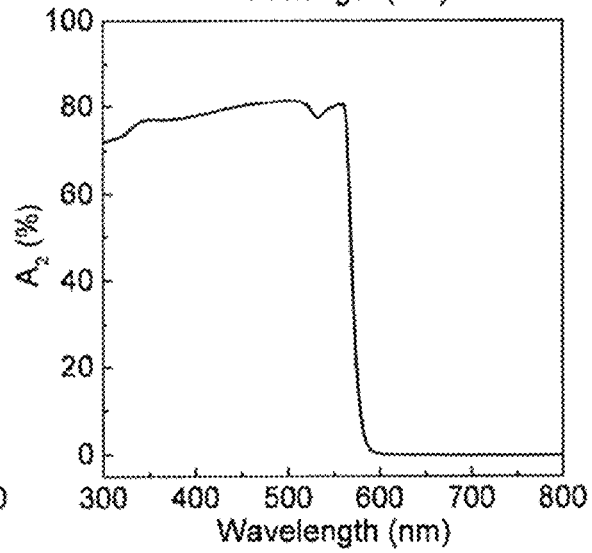
FIG. 6D shows calculated absolute absorption of MAPbBr$_3$ SC.

For perovskite materials, a high quality single crystal (SC) is desired for a large μτ product. In one embodiment, an anti-solvent method developed by Bakr et al. was modified to grow high quality MAPbBr$_3$ SCs (Shi, D. et al. Low trap-state density and long carrier diffusion in perovskite single crystals. Science 347, 519-522 (2015)). Grown SCs with Lead bromide (PbBr$_2$)/methylamine bromine (MABr) molar ratio (MR) of 1.0 gradually changed from clear to opaque as they grew by this method, which was caused by the large solubility difference of MABr and PbBr$_2$ in DMF as shown in FIG. 5A. PbBr$_2$ has a much lower solubility than MABr in DMF. After most of the DMF solvent is consumed by the anti-solvent, PbBr$_2$ precipitates faster than MABr, which might cause non-stoichiometric MAPbBr3 on the surface (see, e.g., FIG. 5B and FIG. 5C). To address this issue, the MR was changed to 0.8, so that there were always more MABr in the solution, which resulted in the growth of clear SCs with size of 1-6 mm as shown in FIG. 1A. In the following discussion, the crystals grown with the PbBr$_2$/MABr MR of 1.0 and 0.8 are referred to as MAPbBr$_3$-MR1.0 and MAPbBr$_3$-MR0.8, respectively. The absolute transparency (T$_2$/T$_1$) of these SCs was quantitatively characterized by a spectrophotometer with an integration sphere which accurately measures the transmittance, reflection and scattering of MAPbBr$_3$ SCs (FIG. 13). The setup of the measurement is shown in the inset of FIG. 1B. A high value of T$_2$/T$_1$ is expected for a clear crystal with less scattering and absorption. For the 2 mm thickness MAPbBr$_3$-MR0.8 and MAPbBr$_3$-MR1.0 SCs, T$_2$/T$_1$ are ~75% and ~40%, respectively (FIG. 1B), confirming the visual result. Powder X-ray diffraction (XRD) confirmed the cubic crystal structure of the MAPbBr$_3$-MR0.8 SCs, and thermogravimetric analysis (TGA) demonstrated an equimolar ratio composition of PbBr$_2$ and MABr in MAPbBr$_3$-MR0.8 SC (see, e.g., FIG. 7A and FIG. 7B). Polarized optical microscopy image excluded the formation of polycrystals, and no holes or bubbles were observed inside the SCs (FIG. 7C and FIG. 7D). Larger SCs have been synthesized with an area of 25 cm$^2$, which are useful for large area array detector applications.

In one specific embodiment, as shown in FIG. 1C for example, MAPbBr$_3$ SC devices having a device structure of Au/MAPbBr$_3$ SC/C$_{60}$/Bathocuproine (BCP)/Ag or Au were fabricated. The hole mobility of the MAPbBr$_3$-MR0.8 SC was derived to be ~217 cm$^2$ V$^{-1}$ s$^{-1}$ (FIG. 1E), slightly higher than that of the MAPbBr$_3$-MR1.0 SC (206 cm$^2$ V$^{-1}$ s$^{-1}$) (FIG. 1D). A comparable electrons mobility of 190 cm$^2$ V$^{-1}$ s$^{-1}$ was measured for the MAPbBr$_3$-MR0.8 SC (FIG. 8). The μτ products of the SCs were measured by the photoconductivity method, which is generally applied to SC radiation detection and also gives surface recombination velocity (s) . The measured photocurrent was fit to the modified Hecht equation:

$$I = \frac{I_0 \mu \tau V}{L^2} \frac{1 - \exp\left(-\frac{L^2}{\mu \tau V}\right)}{1 + \frac{Ls}{V\mu}} \quad (1)$$

where I$_0$ is the saturated photocurrent, L is the thickness, and V is the applied bias. The measured photocurrent curves and fitting curves are shown in FIG. 1F. The MAPbBr$_3$-MR1.0 SC has a μτ product of 1.0×10$^{-2}$ cm$^2$ V$^{-1}$, and a s of 1680 cm s$^{-1}$, while the MAPbBr$_3$-MR0.8 SC has a record μτ product of 1.4×10$^{-2}$ cm$^2$ V$^{-1}$ and a lowers of 1120 cm s$^{-1}$. The μτ product measured here should be dominated by the contribution from holes because of the shorter recombination lifetime of electrons than holes according to carrier recombination lifetime study by microwave photoconductivity measurement. This surface recombination velocity agrees very well with what was measured by the broadband transient reflectance spectroscopy method. All these results indicate that growing MAPbBr$_3$ SCs with more MABr yields better crystals with improved optical and electronic properties. The hole diffusion length L$_D$ was derived to be 190 μm for the MAPbBr$_3$-MR0.8 SC which is in the same order with what was reported previously for MAPbI$_3$ SCs.

Surface Passivation to Enhance Charge Extraction Efficiency

It has been found there may be a large density of surface defects in as-grown perovskite SCs. Although the SC growth method applied here yielded a reduced surface defect density, a significant amount of surface defects exists in these as-grown MAPbBr$_3$ SCs, as evidenced by the large surface recombination velocity measured and relative small internal quantum efficiency (IQE) at short wavelength range (FIG. 9). In one embodiment, a UV-O$_3$ treatment of the top surface of as-grown MAPbBr$_3$ SC (e.g., for 20 min) is performed to increase external quantum efficiency (EQE) and IQE at short wavelengths of the MAPbBr$_3$ SC devices (FIG. 2A), which indicates oxidization can effectively passivate these surface defects. This passivation effect was directly confirmed by the photoluminescence (PL) measurement which is sensitive to surface defects due to the short penetration length of the short wavelength excitation light (405 nm). As shown in FIG. 2B and FIG. 2C, the oxidized MAPbBr$_3$-MR0.8 SCs have 12 times stronger PL intensity and 3 times longer radiative recombination lifetime than the pristine MAPbBr$_3$ SCs under vacuum condition. Additional evidence of the oxidized passivation of the trap states is that the PL of pristine MAPbBr$_3$ SC in the vacuum chamber was much weaker than that in air, while refilling the chamber with air recovered the PL intensity, which also indicates physical absorbing of O$_2$ by MAPbBr$_3$ can also passivate the MAPbBr$_3$ surface. X-Ray photoelectron spectrometer (XPS) measurement was carried out to verify the retention of the oxidization effect by UV-O$_3$ treatment. Here a MAPbBr$_3$ thin film was used instead of a SC in order to avoid charging effect caused by the large thickness of SC. As shown in FIG. 2D, the oxygen is peaks show up after UV-O$_3$ passivation, indicating that high vacuum environment in XPS measurement could not remove the chemically attached oxygen species. This verifies the permanent passivation effect by UV-O$_3$ passivation, which is in accordance with the PL variation. The peak at 528.7 eV is attributed to O atoms bonded to Pb, while the peak centered at 530.3 eV arises from those forming hydroxyl bonds. After UV-O$_3$ passivation, the MAPbBr$_3$-MR0.8 SCs had a 18 times slower surface recombination velocity of 64 cm s$^{-1}$ (FIG. 1F) which is better than the state-of-the-art of passivated Si. The μτ product remained unchanged after passivation, because it is a bulk property. The trap density of states (tDOS) of MAPbBr$_3$ SCs was characterized by thermal admittance spectroscopy. As shown in FIG. 2E, the trap density of the MAPbBr$_3$-MR0.8 SC device is similar to that of MAPbBr$_3$-MR1.0 in most trap-depth ranges, but is about twice as low for deep traps, which again indicates the origin of deep traps from the crystal surfaces. The trap density of MAPbBr$_3$ SC was reduced by ~10 fold after passivation by UV-O$_3$, yielding a trap density between 3×10$^6$-7×10$^7$ cm$^{-3}$ eV$^{-1}$, which is the lowest measured trap density among all known SCs. It should be noted this is an average trap density, and the surface trap density should be much higher than in the bulk.

The surface passivation by oxidization successfully increased the device charge extraction efficiency. Since the EQE spectra of the devices are sensitive to the transparency of the semi-transparent electrodes, the performance of the devices was compared using a thin layer (e.g., 14 nm) of Ag or a thin layer (e.g., 25 nm) of Au as the cathode. A thinner Ag layer could be used because of its better film formation capability on the SCs, and the high work function of Au worked as the cathode due to the $C_{60}$/BCP electron accepting layer inserted between perovskite and Au interface. Since a 14 nm Ag electrode has a transparency ca. 80%~50% from 350 nm to 600 nm, the IQE is 33-42% on average from 350 nm to 520 nm which is close to the IQE of the device with Au as the cathode. This means that among all the holes generated by absorbed photons energy, more than one third of these charge carriers can diffuse and/or drift across the whole thickness of a 2 mm thick crystal under bias (e.g., −0.1 V bias). The device charge extraction efficiency doubled by UV-$O_3$ passivation (see, FIG. 2A and FIG. 9), and the presence of large IQE and EQE at short wavelength region indicates a reduced charge recombination closing to the semi-transparent cathode. It should be noted the electrical field intensity applied here is several orders of magnitude lower than that of the polycrystalline perovskite films to minimize the possible influence of ion migration or electrochemical reaction, despite that a larger IQE close to 100% could be realized at a larger bias of −8 V (FIG. 9).

MAPbBr$_3$ SC Photodetectors and X-Ray Detectors

Figure 3A:
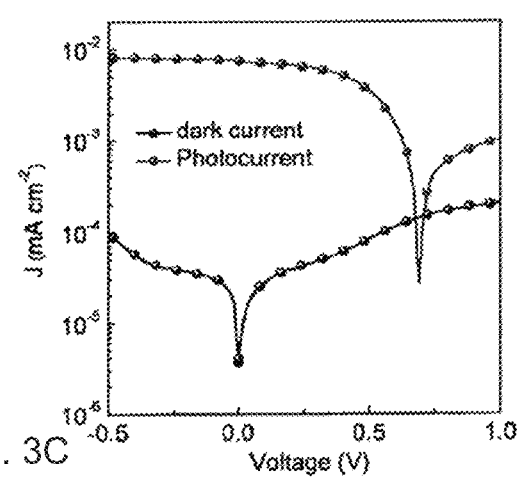
FIG. 3A shows dark-current and photocurrent of a MAPbBr$_3$ SC device.
Figure 3B:
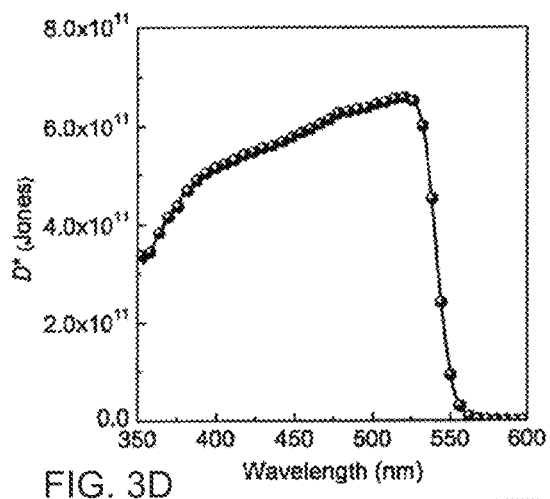
FIG. 3B shows specific detectivity of MAPbBr$_3$ SC device calculated by directly measured IQE and NEP.
Figure 3C:
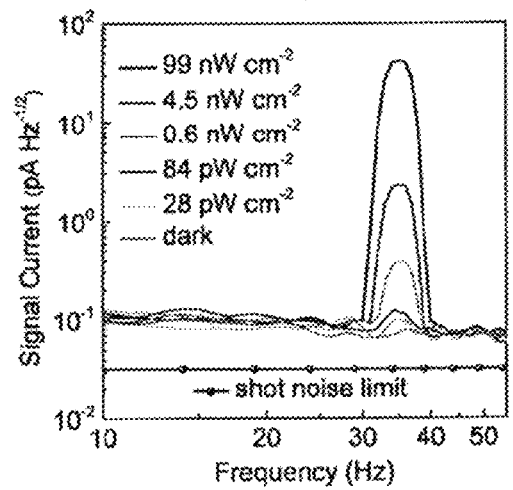
FIG. 3C shows the noise current and photocurrent at different frequency for the MAPbBr$_3$ SC device under −0.1 V bias; the light source is 470 nm LED, modulated at 35 Hz by a functional generator, with light intensity attenuated by neutral density filters.
Figure 3D:
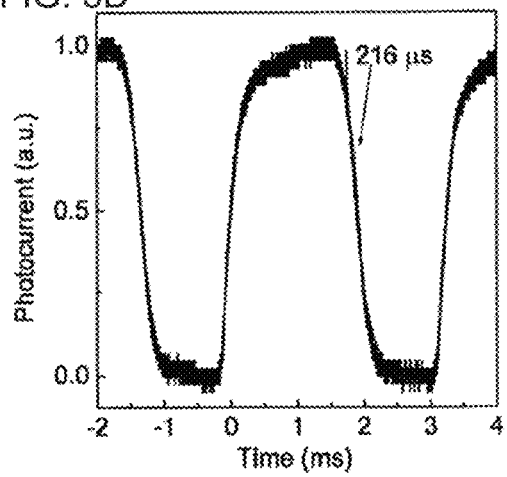
FIG. 3D shows the temporal response of the MAPbBr$_3$ SC device with a thickness of 1 mm under −0.1 V bias.

The sensitivity of a 2 mm thick MAPbBr$_3$-MR0.8 SC device under weak light was characterized. The device showed a small dark-current density of 29 nA cm$^{-2}$ at −0.1 V bias, which gives a bulk resistivity of $1.7 \times 10^7$ Ω cm for MAPbBr$_3$-MR0.8 SC. The device also showed a photovoltaic behavior with a short circuit current density of ~7.8× $10^{-3}$ mA cm$^{-2}$ under room-light (~$2.2 \times 10^{-4}$ W cm$^{-2}$) (FIG. 3A) and an open circuit voltage of 686 mV. A maximum specific detectivity (D*) of $6.6 \times 10^{11}$ cm Hz$^{1/2}$ W$^{-1}$ (FIG. 3B) is derived from the noise current (FIG. 3C) and IQE (FIG. 2A), which gives a noise equivalent power (NEP) of about 10 pW cm$^{-2}$. The noise current is independent of the frequency and close to the calculated shot noise limit from the dark current. White noise, instead of 1/f noise, dominates the total noise due to the low bulk trap density of the perovskite SCs. The NEP was verified by directly measuring the device response to varied light intensity from 100 nW cm$^{-2}$ to 20 pW/cm$^2$, using the combination of a Fast Fourier Transform (FFT) signal analyzer and a low noise current preamplifier. As shown in FIG. 3C, the device signal is distinguished from noise when the light intensity reduces to 28 pW/cm$^2$, which is close to the calculated NEP. Due to the large charge carrier mobility of MAPbBr$_3$ SCs, the detector shows a relatively short response time of 216 µs for the device with a 1 mm thick SC device under −0.1 V (FIG. 3D), and 1.1 ms for the 2.6 mm thick SC device (see, FIG. 10). The transit time of the charge carriers calculated with the measured mobilities for 1 mm and 2.6 mm devices are 200 µs and 1.3 ms, respectively, which agrees well with the measured response time.

Figure 4A:
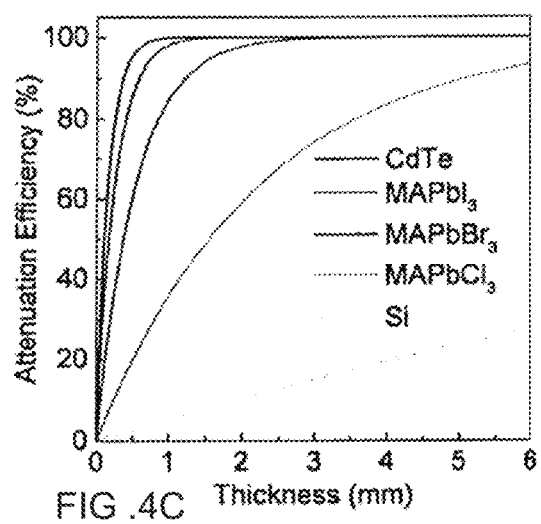
FIG. 4A shows attenuation efficiency of CdTe, MAPbI$_3$, MAPbBr$_3$, MAPbCl$_3$, and Si to 50 keV X-ray photons in the terms of photoelectric effect versus their thicknesses.
Figure 4B:
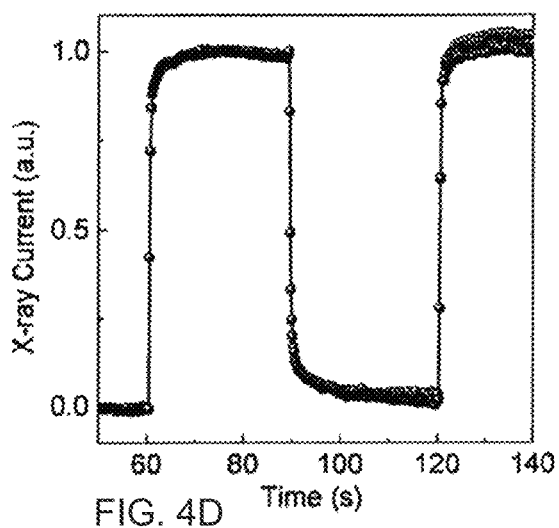
FIG. 4B shows MAPbBr$_3$ SC device response to X-ray by turning on/off the X-ray source.

The 2 mm thick MAPbBr$_3$ SC device was exposed to an X-ray source with a continuum X-ray energy up to 50 keV and peak intensity at 22 keV whose radiation dose rate was calibrated by a silicon detector. The X-ray source was a commercially available Amptek Mini-X tube, with a Ag target and 4 Watt maximum power output. X-rays from the source were collimated using a brass cylinder with a 2 mm circular central bore. Spectra at the sample location were characterized using a high-resolution Si-PIN detector with an additional tungsten aperture boring a 0.4 mm diameter hole, and a function was determined to correlate the X-ray generator voltage and current to kinetic energy released per unit mass (KERMA) in a sample. Mass energy attenuation coefficients from photon cross section database were used in determining KERMA in the perovskite samples. The stopping power of perovskites is similar to that of CdTe, but much stronger than that of Si due to enhanced photoelectric attenuation, as shown by the simulation result in FIG. 4A. The 2 mm thick MAPbBr$_3$ applied in this example attenuated almost all of X-rays within the energy range of the X-ray source used. The very thin gold or silver electrode has negligible X-ray attenuation. The response of the SC devices to X-rays was demonstrated by turning on and off the incident X-rays, as shown in FIG. 4B.

Figure 4C:
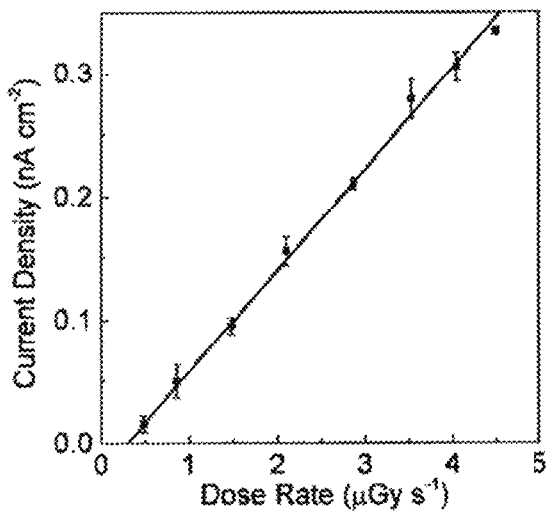
FIG. 4C shows X-ray generated photocurrent as various dose rate all the way down to the lowest detectable dose rate; a sensitivity of 80 μC Gy$_{air}^{-1}$ cm$^{-2}$ is derived from the slope of the fitting line.

Both the sensitivity and lowest detectable dose rate are the most important figures of merit to evaluate the performance of an X-ray detector for medical imaging applications. To evaluate such performance, the total X-ray dose was reduced by a tungsten aperture with diameter of 0.4 mm to control the X-ray beam size, as well as by changing the current of the X-ray tube. Here the same method used in light detection for X-ray detection was applied, i.e., the X-ray intensity was modulated by a thick steel chopper, and the current signal of the SC device was measured by a lock-in amplifier at the same frequency of the chopped X-ray. As shown in FIG. 4C, the generated current density signal has a linear relationship with the X-ray dose rate. The dose used here is the entrance dose in air, and a sensitivity of 80 µC Gy$_{air}^{-1}$ cm$^{-2}$ was derived, which is more than 10 times higher than that of the Cd(Zn)Te SC detector under the same applied electrical field. It is noted although a larger applied field was reported to enhance the current output of the Cd(Zn)Te SC detectors, their sensitivities, which are determined by the signal-to-noise ratio, are not enhanced due to the increased dark current at higher bias. The sensitivity of the perovskite devices was also compared with α-Se X-ray detectors which are the dominating products for x-ray imaging. The MAPbBr$_3$ SC detectors are 4 times more sensitive than that of α-Se X-ray detectors operating at a much higher field of 10 V/µm (20 µC Gy$_{air}^{-1}$ cm$^{-2}$)$^5$. In addition, compared to the polycrystalline perovskite X-ray detectors, the sensitivity improved by >70 times despite the much smaller bias applied here, which clearly reveals the advantage of the application of high µτ product MAPbBr$_3$ SC for X-ray detectors. The lowest detectable X-ray dose rate is 0.5 µGy$_{air}$/s at almost zero bias which is much lower than that needed for the regular medical diagnostics of 5.5 µGy$_{air}$/s.

Figure 4D:
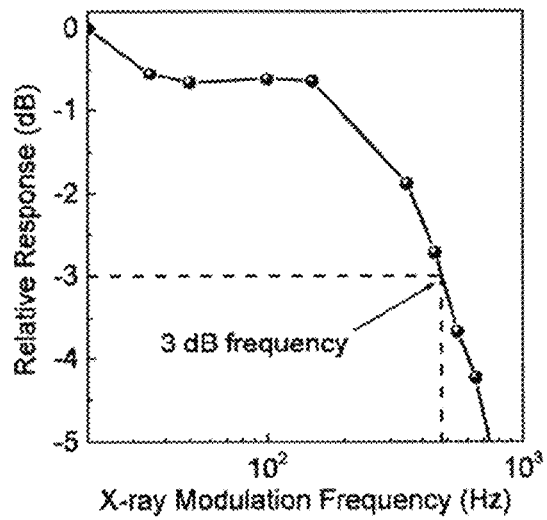
FIG. 4D shows normalized response as a function of input X-ray frequency showing that the 3 dB cutoff frequency is 480 Hz.

An estimation of the charge collection efficiency was determined in the device under X-ray dose rate of 0.86 µGy$_{air}$/s by considering the average energy of the X-ray beam to be 22 keV. The electron-hole pair creation energy (W) can be predicted to be 6.03 eV according to the empirical model of Devanathan et al.:

$$W = 2Eg + 1.43 \qquad (2)$$

where Eg is the bandgap of MAPbBr$_3$. A charge collection efficiency of 16.4% was derived, which is a little lower than the IQE of 33%~42% measured under UV-vis photons. In principle, both electrons and holes may contribute to the signal under X-ray if the lifetime of electrons is as large as that of holes. However, a carrier lifetime study by microwave photoconductivity measurement showed that electrons have a much shorter lifetime, especially at a very weak light intensity. Since the X-ray intensity used in this study is also weak compared to sun light, it is speculated that the major contribution to the signal comes from holes for the device measured under X-ray. The almost zero bias derived charge collection efficiency of the device under very weak X-ray illumination is benefit from the very low trap density of the SCs. For the 2 mm thick device, the measured 3 dB cutoff frequency ($f_{3\ dB}$) response to X-rays is 480 Hz (FIG. 4D), i.e. response time of 730 μs, faster than that estimated from the calculated charge transit time of 800 μs. This can be explained by the fact that charges are generated inside of the crystals by X-ray radiation, and thus the actual charge transit length is smaller than the crystal thickness. Device stability is another important figure-of-merit. The MAPbBr$_3$ SC device is very stable without obvious EQE loss after storing in air for two months as shown in FIG. 11. The EQE measurement was carried out in ambient air conditions for the devices without any protection.

Sensitive MAPbBr$_3$ SC X-ray detectors provide advantageous properties, e.g., a μτ product of $1.2 \times 10^{-2}$ cm$^2$ V$^{-1}$ and a low surface recombination velocity of 64 cm s$^{-1}$. Such extraordinary optoelectronic properties as compared to those of CdZnTe are achieved from the solution grown perovskite SCs and with a surface passivation treatment. The solution growth method has unprecedented advantages of low-cost, large scale, and faster growth rates compared to the vapor deposition method adopted for CdZnTe crystal growth. This will enable low-cost and sensitive radiation detectors to be deployed in the field for a wide range of applications. Using these MAPbBr$_3$ SC X-ray detectors, a charge collection efficiency of 33~42% for UV-vis light, and to ca. 16.4% for hard X-ray photons at almost zero bias condition was demonstrated. This enables the capability to directly convert the high energy X-ray flux into collectable charges with a high sensitivity of 80 μC Gy$_{air}^{-1}$ cm$^{-2}$ and a low detectable dose rate of 0.5 μGy$_{air}$/s, which meets the practical needs of medical diagnostics where the dose rate is typically much larger. Better device performance can be expected if the surface traps are further passivated, and the possible ion-migration problem can be avoided so that a larger bias could be applied to extract more charge at a quicker rate. The present embodiments also offer an effective way to engineer the trap density of the hybrid perovskite material to increase the device charge collection efficiency for other applications, including solar cells and photodetectors.

EXAMPLE METHODS AND CHARACTERIZATIONS FOR MAPbBr$_3$ SCs

Materials. Lead bromide (PbBr$_2$) (>98%, Sigma-Aldrich), Methylamine (CH$_3$NH$_2$) (40% w/w aq. soln., Alfa Aesar), Hydrobromic acid (HBr) (48% w/w aq. soln., Alfa Aesar), C$_{60}$ (>99.5%, Nano-C), Bathucoproine (BCP) (>96%, Sigma-Aldrich), N,N-Dimethylformamide (DMF) (>99.8%, Alfa Aesar), Dichloromethane (DCM) (99.7%, Alfa Aesar).

Synthesis of methylamine bromine (MABr). MABr was prepared by slowly mixing methylamine with HBr in 1:1 molar ratio under continuous stirring at 0° C. for 2 h. MABr was then crystallized by removing the solvent from an evaporator, washing three times in diethyl ether, and filtering the precipitate. The white crystal was then dried in vacuum for 24 h, and kept in a dark and dry environment for further use.

Growth of MAPbBr$_3$ single crystal (SC). 0.64 M PbBr$_2$ and 0.8 M MABr were dissolved into 5 ml DMF solution in a 20 ml vial to keep the molar ratio of PbBr$_2$ to MABr is 0.8. Then the vial was sealed with foil, but leaving a small hole to let DCM slowly get in. DCM was employed as anti-solvent to precipitate the SCs. Finally, the vial was stored in the atmosphere of DCM, and MAPbBr$_3$-MR0.8 SC can slowly grow big in two days. Molar ratio of PbBr$_2$ to MABr of 1.0 is also used for comparison to grow MAPbBr$_3$-MR1.0 SC.

Optical measurement. The absolute transparency was characterized using $T_2/T_1$ where $T_1$ and $T_2$ represent the injected and transmitted light into and out of the SCs, respectively. Absolute transparency was shown in the wavelength range from 600 nm to 800 nm where the crystal has no band-transition.

Device fabrication. 25 nm Au as anode is deposited on the top surface of the MAPbBr$_3$ SC through thermal evaporation with a mask to define the area, then on the bottom surface, electrons-transporting layers are constructed by depositing 20 nm C$_{60}$ and 8 nm BCP. Finally, 14 nm Ag or 25 nm Au is employed as semi-transparent cathode by using a thermal evaporation system through a shadow mask under high vacuum. For UV-O$_3$ passivation device, the top surface of the MAPbBr$_3$ SC is treated by UV-O$_3$ for 20 min before depositing anode electrode. Device area varies from 4 to 16 mm$^2$ according to size of MAPbBr$_3$ SC.

Characterization of the Material Structure

Powder XRD measurements of methylammonium lead bromide (MAPbBr$_3$) were performed with a Rigaku D/Max-B X-ray diffractometer with Bragg-Brentano parafocusing geometry, a diffracted beam monochromator, and a conventional cobalt target X-ray tube set to 40 kV and 30 mA. The MAPbBr$_3$ single crystal (SC) powders were made by grinding one piece of MAPbBr$_3$ SC into fine powders in a mortar. The X-ray photoemission spectroscopy (XPS) was performed using a VG ESCA Lab system and the instrumental resolution for XPS is ca. 1.4 eV.

Characterization of the Optical Properties

The transmittance, scattering, reflection and absorption of MAPbBr$_3$ SC were measured by using a UV/Vis/NIR Lambda 1050 Spectrophotometer with integration sphere from PerkinElmer. A mask with area of ca. 5 mm$^2$ was used to confine the optical path whose area is smaller than the big crystals with 2 mm thickness. The transmittance (T$_2$), scattering (S$_2$) and reflection plus front scattering (R$_1$+S$_1$) were measured, respectively. The absorption was calculated according to the equation (3).

$$A_2 = 1 - R_1 - S_1 - T_2 - S_2 \tag{3}$$

Characterization of the Mobility by Time of Flight (ToF) Method

Hole mobility measurement was conducted by illuminating the devices with 4 ns width, 337 nm laser pulses (SRS N$_2$ laser) from the semitransparent Ag cathode. The pulse laser generated weak photocurrent was first amplified by a SR-570 current pre-amplifier, which has a bandwidth of 1 MHz, and then recorded using an Agilent 1 GHz digital oscilloscope (Agilent DSO-X 3104A). Only a thin sheet of charges were generated close to the semi-transparent electrodes. The photogenerated electrons were collected by the Ag cathode immediately, and the photogenerated holes traveled through the MAPbBr$_3$ SC under reverse bias until reaching the other electrode. The Schottky junction effectively prevented charge injection under reverse bias, which allowed clear ToF signals to be extracted and recorded. The hole mobility was calculated from the equation (4).

$$\tau_{transit\ time} = \frac{d^2}{\mu V} \tag{4}$$

where d is thickness of the SCs, V is the applied voltage bias, μ is the charge carriers mobility and τ is the transit time of the charge carriers. Due to the dispersive transport property of carriers in the SC, the charge transit time was determined from the intercept of the pre-transit and post-transit asymptotes of the photocurrent on a double-logarithmic scale plot as shown in FIG. 1D and FIG. 1E. The built-in potential in the device is about 0.9 V which was estimated from the work function difference between the two electrodes of the device. It was added to the applied potential to obtain an accurate estimation of the electric field in the crystal. For electron mobility measurement, laser was illuminated on the semi-transparent Au anode. The photogenerated electrons traveled through the MAPbBr$_3$ SC under reverse bias until reaching the other electrode.

Characterization of the Photoconductivity of the MAPbBr$_3$ SC

Photoconductivity measurement was carried out on the MAPbBr$_3$ SC device with a thickness of 2~3.5 mm, and a device area of 3~5 mm$^2$. Excitation light from a 470 nm LED, modulated at 35 Hz by a function generator, was illuminated on the Ag cathode of the device. Due to the heterojunction formed between Au and MAPbBr$_3$ SC as well as the one at the interface of MAPbBr$_3$ SC/C$_{60}$/BCP/Ag, charges injection is minimized under reverse bias condition. Different reverse bias was supplied by a Keithley 2400 source-meter, and photocurrent was recorded by a SR-830 lock-in amplifier. A fitting of the observed photocurrent verse reversed bias voltage using modified Hecht equation yields both μτ product and s for holes. The μτ product reflects the crystal bulk electronic property, and it is proportional to the charge carrier diffusion length, while s presents the surface recombination velocity which directly affects the charge collection efficiency. Work function difference between the two electrodes of the device was also added in the same way as ToF measurement.

Characterization of the Trap Density of MAPbBr$_3$ SC

Trap density was measured by thermal admittance spectroscopy (TAS), and the SC device was kept under one sun illumination during the entire measurements. The experiments were performed by using an Agilent E4980A Precision LCR Meter with frequencies between 0.1 to 1000 kHz. The energy profile of trap density of states (tDOS) was derived from the angular frequency dependent capacitance with the equation (5).

$$N_T(E_\omega) = -\frac{V_{bi}}{qW}\frac{dC}{d\omega}\frac{\omega}{k_B T} \quad (5)$$

where C is the capacitance, ω is the angular frequency, q is the elementary charge, k$_B$ is the Boltzmann constant and T is the temperature. V$_{bi}$ and W are the built-in potential and depletion width, respectively, which were extracted from the Mott-Schottky analysis. The applied angular frequency ω defines an energetic demarcation.

$$E_\omega = k_B T \ln\left(\frac{\omega_0}{\omega}\right),$$

where ω$_0$ is the attempt-to-escape frequency.

Characterization of the EQE of MAPbBr$_3$ SC

The external quantum efficiency (EQE) was measured with the Newport QE measurement kit by focusing monochromatic beam of light onto the devices. The incident light was chopped at 35 Hz, and the optical power density was controlled to be around 1 μW/cm$^2$. A Si diode which had calibrated response from 280 nm to 1100 nm was used to calibrate the light intensity for photocurrent measurement.

Characterization of the Noise, NEP and D* of MAPbBr$_3$ SC

Noise current was carried out at different frequency by a Fast Fourier Transform (FFT) signal analyzer (Agilent 35670A) which was connected to a low noise current preamplifier, and noise equivalent power (NEP) was directly measured in the same way as noise current but illuminating a modulated light on the device with gradually attenuated light intensity. Specific detectivity (D*) is calculated according to equation (6).

$$D^* = \frac{(AB)^{1/2}}{NEP} \quad (6)$$

where A is the device area, B is the bandwidth, NEP is the noise equivalent power.

FIG. 5 shows the origination of opaque surface for MAPbBr$_3$-MR1.0 SC, which caused by the huge solubility difference between PbBr$_2$ and MABr in DCM/DMF mixture solvent (FIG. 5A). Non-stoichiometric MAPbBr$_3$ caused the opaque surface of SCs. After washing the opaque surface of SC, it became clear again.

FIG. 6 presents the basic optical characterization of MAPbBr$_3$-MR0.8 SC. When light was illuminated on the surface of SC, there was about 20%~30% reflectance and front scattering at the front surface. The remaining part of light penetrated into the crystal and induced absorption, transmittance and scattering. Absolute absorption was calculated according to the measured reflectance, transmittance and scattering.

FIG. 7A and FIG. 7B show the powder XRD and TGA of MAPbBr3-MR0.8 SC, and a cubic structural with equimolar composition of PbBr$_2$ and MABr was proved. The weight loss located at around 322° C. was attributed to the decomposition of MAPbBr$_3$, and only PbBr$_2$ was left. The weight loss at around 580° C. was attributed to the decomposition of PbBr$_2$. FIG. 7D is the polarized microscopy image with two polarizers perpendicular to each other, so the background was dark and no light signal was collected by the CCD. While if a uniform crystal was inserted between the two polarizers, light signal can be collected then. From FIG. 7C and FIG. 7D a clear and uniform SC image is seen which indicates the SC nature and uniformity. The black spots on the SC are due to the height fluctuation on SC surface.

Electrons mobility is derived from ToF measurement by illuminating light on the anode side of the device. Electrons mobility of 190 cm$^2$ V$^{-1}$ s$^{-1}$ was observed as shown in FIG. 8, which is comparable to holes mobility.

As shown in FIG. 9, IQE of MAPbBr$_3$ SC device w/o UV-O$_3$ passivation under −0.1 V is about twice lower than that with UV-O$_3$ passivation (FIG. 2A), and the IQE is nearly 100% under −8 V for passivated devices.

The response time derived from MAPbBr$_3$-MR0.8 SC device with thickness of 2.6 mm is 1.1 ms under −0.1 V bias, as shown in FIG. 10. The response time was comparable to the transit time of 1.3 ms which was calculated by the measured charges carrier mobility and built-in potential of the device, where the built-in potential was derived from the Fermi level difference between Au and C$_{60}$.

FIG. 11 shows the air stability of the X-ray detector, and there was no EQE loss after storage in air for two months.

Cl Alloying to Increase the Charge Carrier Mobility and μτ Product

Figure 12A:
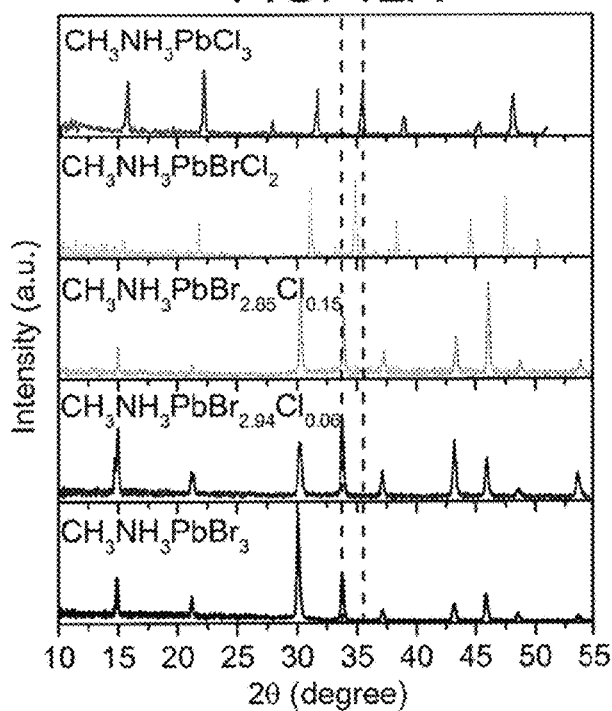
FIG. 12A shows XRD data of MAPbBr$_{3-x}$Cl$_x$ SC powder with different Cl amount.
Figure 12B:
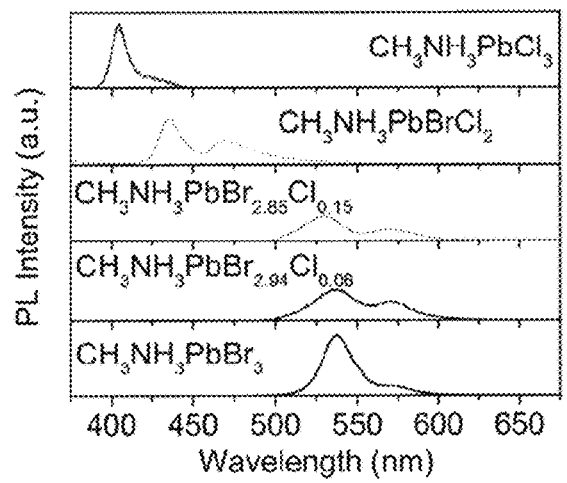
FIG. 12B shows corresponding photoluminescence spectrum of MAPbBr$_{3-x}$Cl$_x$ SC.
Figure 12C:
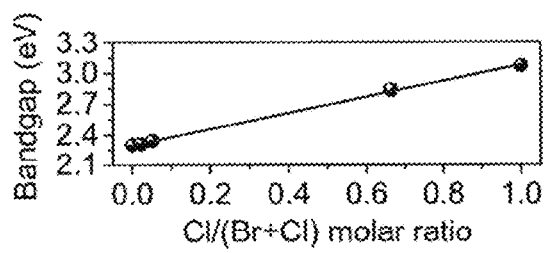
FIG. 12C shows bandgap shift as Cl/(Br+Cl) ratio.
Figure 12D:
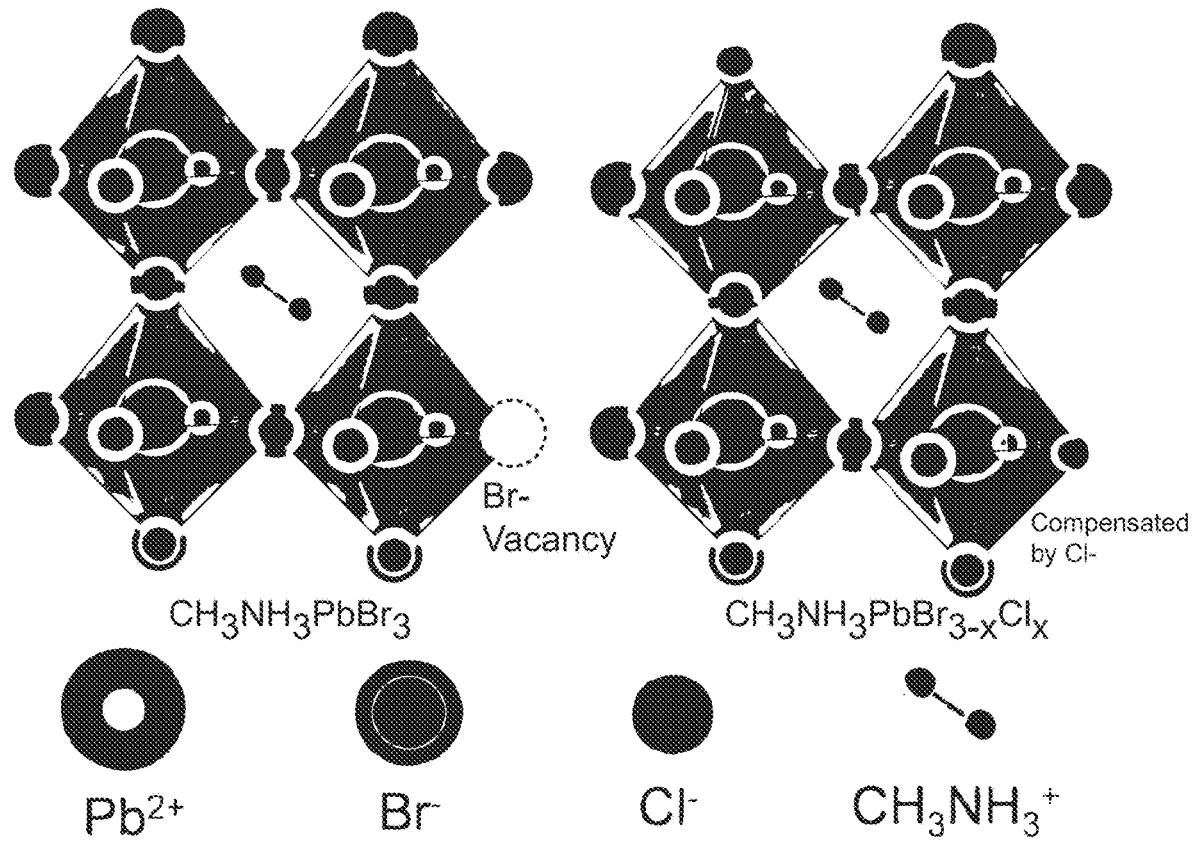
FIG. 12D is a scheme to show that Cl is alloyed into the lattice of MAPbBr$_3$ SC.

In certain embodiments, MAPbBr$_3$ perovskite single crystals are alloyed with Cl into the lattice to manipulate the mobility, charge carrier concentration, and thus the dark current and detector performance. The XRD data in FIG. 12A shows that all the diffraction peaks gradually shift to larger angles as the Cl$^-$ molar ratio in the precursor solution is increased from 1.37% to 52.7%, indicating a successful incorporation of Cl$^-$ into the lattice. The actual Cl$^-$/(Br$^-$+Cl$^-$) molar ratio in the crystals are calculated based on the shift of the (012) diffraction peak by assuming the effectiveness of the Vegard's law. The crystals grown with Cl$^-$ feeding ratios of 1.37% and 4.90% have Cl$^-$/(Br$^-$+Cl$^-$) molar ratio of 2.0% and 5.1%, giving compositions of CH$_3$NH$_3$PbBr$_{2.94}$Cl$_{0.06}$ and CH$_3$NH$_3$PbBr$_{2.85}$Cl$_{0.15}$, respectively. The bandgap derived from the main photoluminescence emission peak presents a linear relationship with the actual Cl/(Br+Cl) molar ratio as shown in FIG. 12C, suggesting a continuously controllable bandgap by alloying Cl. All this proved that Cl alloying causes replacement of Br atoms by Cl atoms in the lattice as shown in FIG. 12D. It will be appreciated that other feeding ratios may be used.

The charge carrier mobility, $\lambda = e \cdot \tau / m^*$, determined by carrier's effective mass, $m^*$, and its average scattering (or momentum relaxation) time, $\tau$, is one of the more important factors to the device performance where e is the elementary charge. The effective mass of perovskite is calculated to be as small as 0.1 $m_0$, where $m_0$ is a bare electron mass, making it possible to exhibit a large mobility over 1000 cm$^2$ V$^{-1}$ s$^{-1}$ in theory for hybrid perovskites, much greater than the current experimental values. This prediction also points out that the native excellent properties of perovskite. High quality perovskite single crystal offers such a platform to study the native mobility of perovskite due to the absence of grain boundary and extremely low trap density. The mobility improvement of MAPbBr$_{3-x}$Cl$_x$ single crystal by alloying small amount of Cl is attributed to the extended average scattering time of carriers. Theoretical calculations reported that Cl alloying in I based perovskite would extend the carrier's thermalization time, which was mainly caused by the structural deformation of PbI$_6$ octahedra and lattice parameter changes after alloying Cl. As the alloying amount of Cl further increased to 5% or even 80%, the mobility dropped quickly and this may be caused by the increased amounts of scattering centers, thus shorter scattering time. It should be appreciated that the alloying amount of Cl can range from about 1% to about 80% or greater.

Figure 13A:
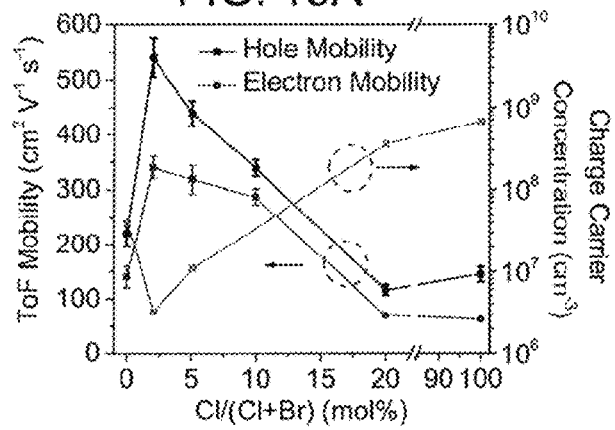
FIG. 13A shows hole and electron mobilities of the MAPbBr$_{3-x}$Cl$_x$ SC using ToF method.
Figure 13B:
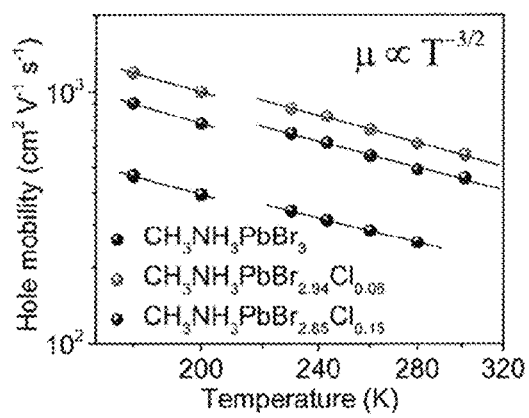
FIG. 13B shows hole mobility of MAPbBr$_{3-x}$Cl$_x$ SC as temperature.
Figure 13C:
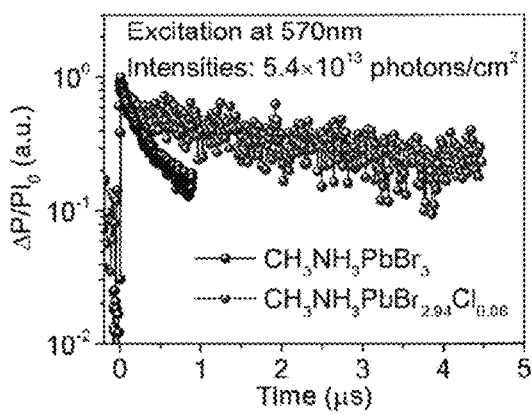
FIG. 13C shows charge carrier recombination lifetime of MAPbBr$_{3-x}$Cl$_x$ SCs.
Figure 13D:
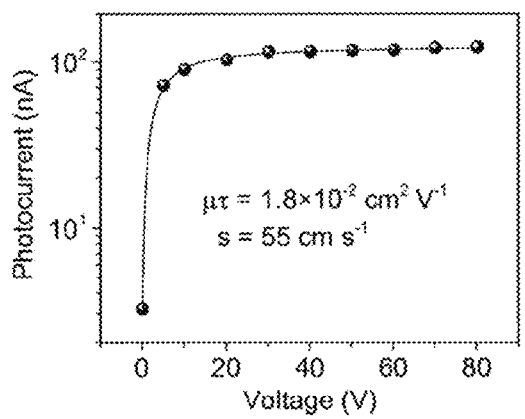
FIG. 13D shows photoconductivity study of MAPbBr$_{3-x}$Cl$_x$ SC with 2% Cl doping.

In order to reveal both the electron and hole mobilities of the MAPbBr$_{3-x}$Cl$_x$ single crystals, the electron and hole mobilities of MAPbBr$_{3-x}$Cl$_x$ single crystals were characterized using the Time-of-Flight (ToF) method. It should be noted that C$_{60}$ and BCP are subsequently deposited on the cathode side as electrons transport layer to reduce the charge injection and promote the charge transfer and separation. FIG. 13A shows that the ToF hole mobility of the CH$_3$NH$_3$PbBr$_3$ single crystal is ca. 220 cm$^2$ V$^{-1}$ s$^{-1}$ at room temperature which agrees with previously reported results. The addition of 2.0% Cl$^-$ into CH$_3$NH$_3$PbBr$_3$ dramatically increased the hole mobility to over 560 cm$^2$ V$^{-1}$ s$^{-1}$. Further increasing the Cl$^-$ percentage to 20% reduced the hole mobility to 130 cm$^2$ V$^-$ s$^-$ which is comparable to that of the CH$_3$NH$_3$PbCl$_3$ single crystal. The ToF curves of the single crystal devices with 0%, 2.0% and 5.1% Cl$^-$ alloying are shown in FIG. 17. Electron mobility followed the same trend as the hole mobility. The ToF electron mobility of CH$_3$NH$_3$PbBr$_3$ single crystal is roughly 140 cm$^2$ V$^{-1}$ S$^{-1}$, and increases to 340 cm$^2$ V$^{-1}$ s$^{-1}$ for crystals with 2.0% Cl$^-$ alloying, then gradually decreases to 320 cm$^2$ V$^{-1}$ s$^{-1}$ for 5.1% Cl$^-$ alloying of a single crystal. Therefore, the dopant compensated crystal has both the highest hole and electron mobility. Although the electron mobility is slightly lower than the hole mobility, they are still within the same order of magnitude. To study the limiting factor for carrier mobilities of MAPbBr$_{3-x}$Cl$_x$ single crystals, the temperature dependent hole mobility was measured from 300 K to 160 K using ToF method as presented in FIG. 13B. The mobilities of MAPbBr$_{3-x}$Cl$_x$ single crystals with 0%, 2% and 5.1% Cl alloying are closely dependent on the temperature and present a proportional relationship versus T$^\alpha$, and similar α values of −1.5 were derived from the slope of the mobility versus temperature curves between 300 K and 230 K for all the three single crystal devices. An abnormal inflection of hole mobility was observed as the temperature decreased from 230 K to 200 K, and further decreasing the temperature resulted in a similar a value, suggesting pure acoustic phonon scattering dominates the mobility rather than impurity scattering. The abnormal inflection of the hole mobility between 200 K and 230 K is attributed to the phase transition from cubic phase to tetragonal phase at around 225 K. In addition, MAPbBr$_{3-x}$Cl$_x$ single crystal with 2% Cl presents champion hole mobility of 560 cm$^2$ V$^{-1}$ s$^{-1}$ under 300 K, and it eventually exceeds 1200 cm$^2$ V$^{-1}$ s$^{-1}$ under 160 K, indicating the high quality of the MAPbBr$_{3-x}$Cl$_x$ single crystal. Table 1 summarizes the ToF mobility and measured single crystals resistivity, and the charge carrier concentration n is determined by n=1/(R μ e).

TABLE 1

Calculated charge carrier concentration.

| | 0% | 2% | 5% | 20% | 100% |
|---|---|---|---|---|---|
| Charge carrier type | p | p or n | n | n | n |
| Hole Mobility[a] (cm$^2$ V$^{-1}$ s$^{-1}$) | 220 | 540 | 439 | 116 | 145 |
| Electron Mobility[a] (cm$^2$ V$^{-1}$ s$^{-1}$) | 140 | 340 | 318 | 70 | 62 |
| Resistivity[b] (Ω cm) | 7.1 × 10$^8$ | 3.6 × 10$^9$ | 1.8 × 10$^9$ | 2.5 × 10$^8$ | 1.5 × 10$^8$ |
| Charge carrier concentration (cm$^{-3}$) | 4.0 × 10$^7$ | 3.2 × 10$^6$ | 1.1 × 10$^7$ | 3.6 × 10$^8$ | 6.7 × 10$^8$ |

Figure 13E:
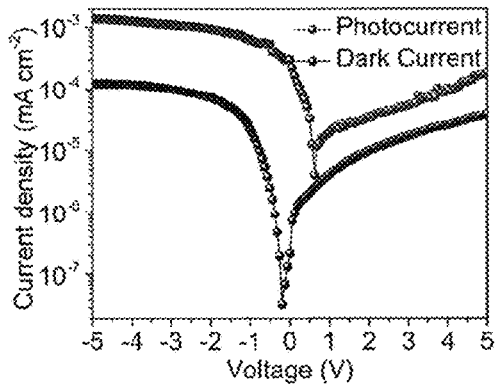
FIG. 13E shows dark-current and photocurrent of the MAPbBr$_3$ SC device.
Figure 13F:
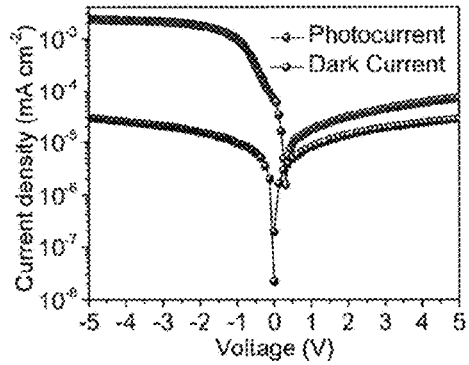
FIG. 13F shows dark-current and photocurrent of MAPbBr$_{3-x}$Cl$_x$ SC device.

[a]Mobility is measured by ToF technique
[b]Resistivity is derived from devices with guard ring electrode The carrier recombination lifetime in the single crystals was studied by time-resolved microwave conductance (TRMC), where a 570 nm laser pulse was utilized to generate free charges. Since photons with 570 nm wavelength can fully penetrate the bulk of the single crystal, charges are generated not only at the surface but also inside the single crystal. A weak nanosecond laser pulse of 5.4× 10$^{13}$ photons/(cm$^2$ pulse) was successfully used for excitation. A lifetime of ~5 μs was recorded for the CH$_3$NH$_3$PbBr$_{2.94}$Cl$_{0.06}$ single crystals, which is a tenfold increase as compared to that of pure CH$_3$NH$_3$PbBr$_3$ single crystals. The photoconductivity study on MAPbBr$_{3-x}$Cl$_x$ single crystal with 1% Cl reveals a record μτ product of 1.8 cm$^2$ V$^{-1}$ with a very low surface recombination velocity of 55 cm s$^{-1}$, indicating the advantage of MAPbBr$_{3-x}$Cl$_x$ single crystal. As shown in FIG. 13E and FIG. 13F, the photocurrent of the CH$_3$NH$_3$PbBr$_{2.94}$Cl$_{0.06}$ device under ambient light with intensity of ~2×10$^{-4}$ W cm$^{-2}$ is slightly larger than that of the CH$_3$NH$_3$PbBr$_3$ device, indicating a more efficient collection of photo-generated charges.

X-Ray Detector Performance and Imaging

Figure 14A:
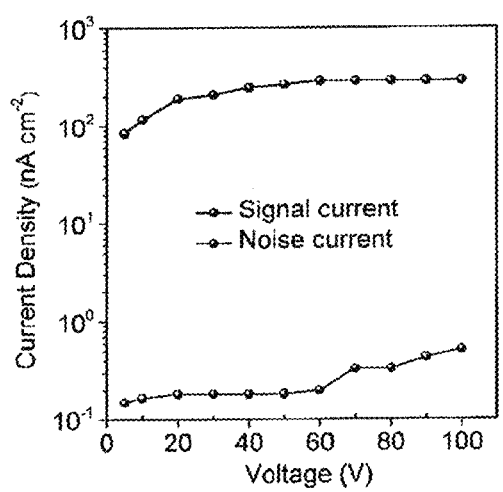
FIG. 14A shows current density output to 8 keV X-rays with dose rate of 2.4 μGy$_{air}$ s$^{-1}$ and noise current density of 1 mm thick MAPbBr$_{3-x}$Cl$_x$ SC device as bias.
Figure 14B:
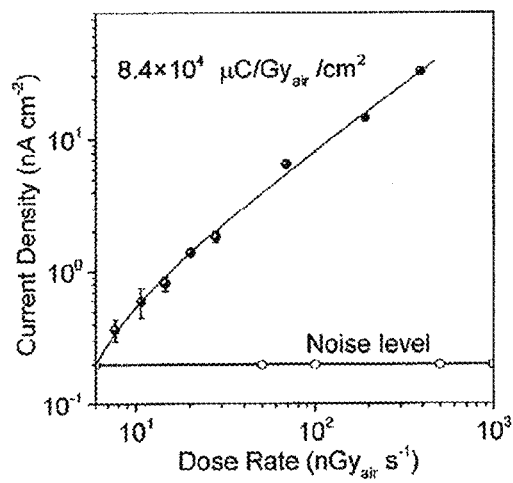
FIG. 14B shows current density output of 1 mm thick MAPbBr$_{3-x}$Cl$_x$ SC device to 8 keV X-rays with different dose rate; a sensitivity of 84000 μC Gy$_{air}^{-1}$ cm$^{-2}$ is derived from the slope of the fitting line.
Figure 14C:
FIG. 14C shows a photoimage of a pencil, and inset photo is the X-ray image of the central part of the pencil; the X-ray dose rate is 2.4 μGy$_{air}$ s$^{-1}$
Figure 14D:
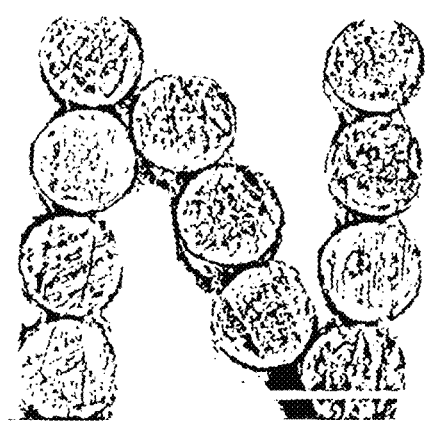
FIG. 14D shows a photoimage and X-ray image of the copper cylinders under extremely low dose rate of 7.6 nGy$_{air}$ s$^{-1}$; all the scale bars are 5 mm.
Figure 14D:
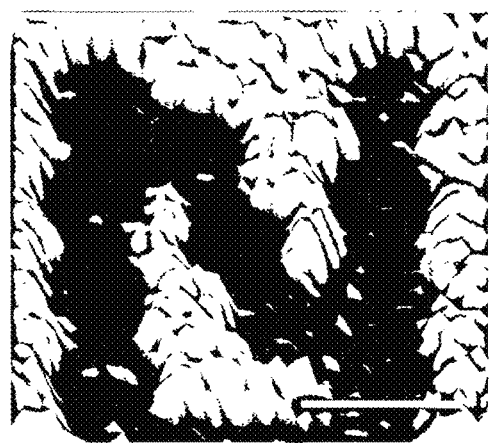

A thick chopper was used to modulate an 8 keV X-ray source, and the X-ray induced current was recorded with a lock-in amplifier. A 1 mm thick MAPbBr$_{3-x}$Cl$_x$ single crystal was applied to fully attenuate the X-ray photons, and by applying different bias, the noise current and signal current were measured under a dose rate of 2.4 µGy$_{air}$ s$^{-1}$ as shown in FIG. 14A, and it was found that 60 V bias was an optimized operating voltage since the noise current sharply grew from 0.2 nA cm$^{-2}$ to 0.33 nA cm$^{-2}$ if the bias was increased to 70 V, while the signal current got saturated to ca. 290 nA cm$^{-2}$. Part of a pencil was used as a mask, and one X-ray image was taken by moving a single pixel single crystal detector with an X-Y stage and the device area is about 0.06 mm$^2$. As shown in FIG. 14C, the graphite part as refill layer in the inner center of the pencil was clearly seen due to the attenuation efficiency difference to X-ray photons. The clear X-ray image triggered an evaluation of the sensitivity of the single crystal detector as well as the lowest detectable dose rate, which is one of the most important figure-of-merit for medical imaging application to evaluate the minimum X-ray dose exposed to a human body. Different layers of aluminum foils were used as X-ray filters to reduce the X-ray dose rate, and the dose rate was calibrated by a commercialized X-ray detector. The sensitivity of the MAPbBr$_{3-x}$Cl$_x$ single crystal detectors was derived from slope of fitted straight line of the signal current density versus dose rate in liner scale, and the sensitivity is 8.4×10$^4$ µC Gy$_{air}^{-1}$ cm$^{-2}$, over 4000 times higher than commercialized α-Se X-ray detectors. The lowest detectable dose rate is about 7.6 nGy$_{air}$ s$^{-1}$ which is over 60 times lower than previous results (FIG. 14B). However, X-ray imaging at such low dose rate is still challenging, since the signal-to-noise ratio is only around 2~3, which requires both the signal current and noise current are stable enough to get a clear image with distinguished contrast. MAPbBr$_{3-x}$Cl$_x$ single crystal offers such a possibility to supply continuously stable photocurrent and dark current, and as shown in FIG. 14D, several copper cylinders which are aligned in the shape of letter "N" were mapped, and clear 3D X-ray image was obtained at the dose rate of 7.6 nGy$_{air}$ s$^{-1}$. In order to evaluate the dose applied on a human body for routine medical imaging, the dose-area product (DAP) was estimated to compare the absorbed dose with commercialized X-ray detectors. Assuming a working area of a detector array is about 100 cm$^2$ for 100 keV X-rays, and 211 nGy$_{air}$ s$^{-1}$ dose rate before penetrating 20 cm depth of human body, a DAP rate of 0.076 Gy$_{air}$ cm$^2$ h$^{-1}$ in interventional cardiology was derived, which is at least two orders magnitude lower than the commercialized state-of-the-art X-ray detectors.

Dopant Compensation to Reduce Dark Current

The conductivity of a CH$_3$NH$_3$PbBr$_{2.94}$Cl$_{0.06}$ single crystal was directly compared with a control CH$_3$NH$_3$PbBr$_3$ single crystal which has a similar thickness of about 2 mm. A device structure of Cr/CH$_3$NH$_3$PbBr$_{3-x}$Cl$_x$/C$_{60}$/BCP/Cr was used. FIG. 13E and FIG. 13F show that the dark current density of the CH$_3$NH$_3$PbBr$_{2.94}$Cl$_{0.06}$ device under the same electric field is more than five times smaller than that of the control CH$_3$NH$_3$PbBr$_3$ device, indicating that the p-type doped CH$_3$NH$_3$PbBr$_3$ is effectively compensated by Cl$^-$ alloying. The electronic conductivity of a semiconductor is determined by the product of free charge carrier concentration and carrier mobility (µ). The objective of dopant compensation is to reduce the concentration of free charges, but not the carrier mobility which would otherwise compromise the device's responsivity. It is found that the dopant compensation did not sacrifice the responsivity of the CH$_3$NH$_3$PbBr$_{2.94}$Cl$_{0.06}$ devices.

Figure 15A:
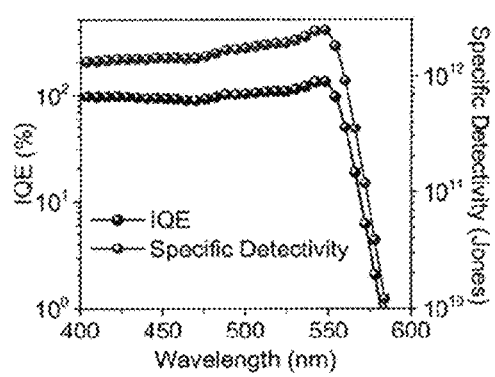
FIG. 15A shows the internal quantum efficiency (IQE) or CCE under −5 V bias.
Figure 15B:
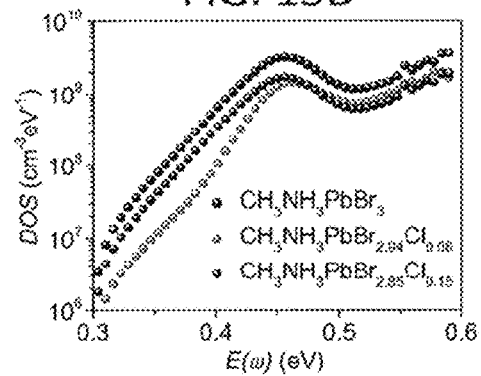
FIG. 15B shows trap density of states of the MAPbBr$_{3-x}$Cl$_x$ SC devices with different Cl amount.

In order to quantitatively characterize the charge collection efficiency (CCE), the external quantum efficiency (EQE) of the single crystal devices were measured. Through dividing the EQE spectrum by electrode transparency, the internal quantum efficiency (IQE) or CCE under −5 V bias were described in FIG. 15A. It is clearly seen that the CCE of the MAPbBr$_{3-x}$Cl$_x$ single crystal device with 2% Cl alloying reached 100% under −5 V bias condition, better than the MAPbBr$_3$ single crystal device result. Other than the high mobility or µτ product of MAPbBr$_{3-x}$Cl$_x$ single crystal, its low trap density also contributes to this extraordinary result as shown in FIG. 15B. According to thermal admittance spectroscopy measurements, the trap density of states (tDOS) of MAPbBr$_{3-x}$Cl$_x$ single crystal with 2% Cl is nearly one order magnitude lower than that of pure MAPbBr$_3$ single crystal, and 5.1% Cl single crystals shares similar trap density in deep trap depth, but a little higher in shallow trap depth range, which may be caused by the increased scattering centers amounts.

Figure 15C:
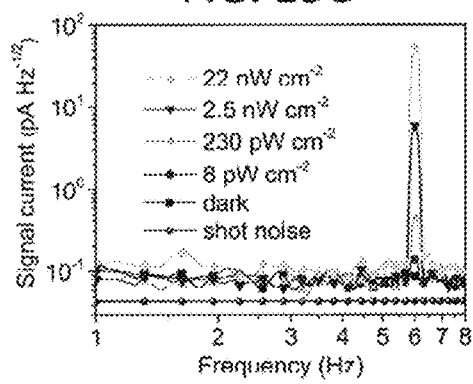
FIG. 15C shows noise current and directly measured NEP of MAPbBr$_{3-x}$Cl$_x$ SC device under −5 V bias.
Figure 15D:
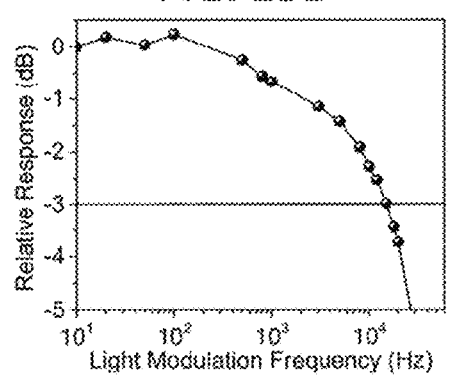
FIG. 15D shows temporal response of the MAPbBr$_{3-x}$Cl$_x$ SC device with a thickness of 2.4 mm under −5 V bias.

Excellent weak light detection capability often predicts excellent X-ray detector performance if the X-ray photons can be fully attenuated, and one of the more important figure-of-merit for a photodetector is the noise equivalent power (NEP) which is used to characterize the capability to detect weak light with low photons flux intensity. The accurate NEP was evaluated by directly measuring the lowest detectable light intensity all the way down to the undistinguished noise level in FIG. 15C. The noise current of MAPbBr$_{3-x}$Cl$_x$ single crystal device at −5 V is about 0.085 pA Hz$^{-1/2}$, and acts as shot noise, which is independent on the frequency. The lowest distinguishable light intensity is ca. 8 pW cm$^{-2}$ which corresponds to a directly measured NEP of 1.3 pW Hz$^{-1/2}$, similar to the calculated NEP (2 pW Hz$^{-1/2}$) using responsivity and directly measured noise. A high specific detectivity D* of 2.5×10$^{12}$ Jones was realized by using the IQE derived responsivity and noise current. It is noted that IQE is used here because X-ray photons can easily penetrate the thin metal electrode. The 3dB response property of MAPbBr$_{3-x}$Cl$_x$ single crystal with 2% Cl under −5V bias was evaluated, and the cutoff frequency is about 15.2 kHz, which corresponds to a response time of 23 µs. This value is also similar to the calculated transit time of 21 µs by using a 2.4 mm thick single crystal with presumed hole mobility of 560 cm$^2$ V$^{-1}$ s$^{-1}$.

Figure 18A:
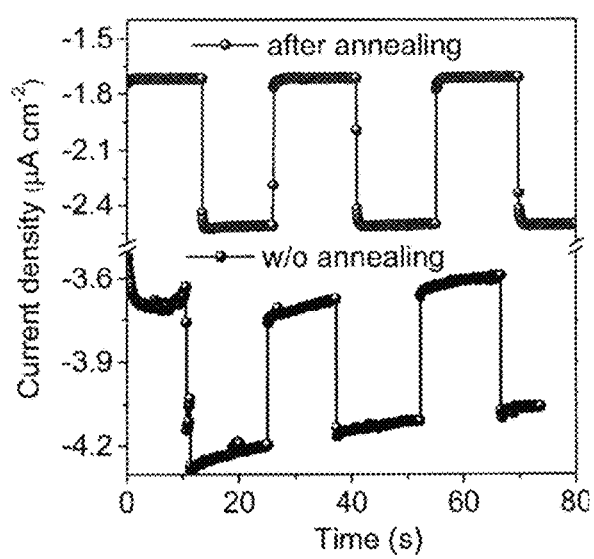
FIG. 18A shows dark current and photocurrent stability of $MAPbBr_3$ single crystal devices with and without annealing treatment.
Figure 18B:
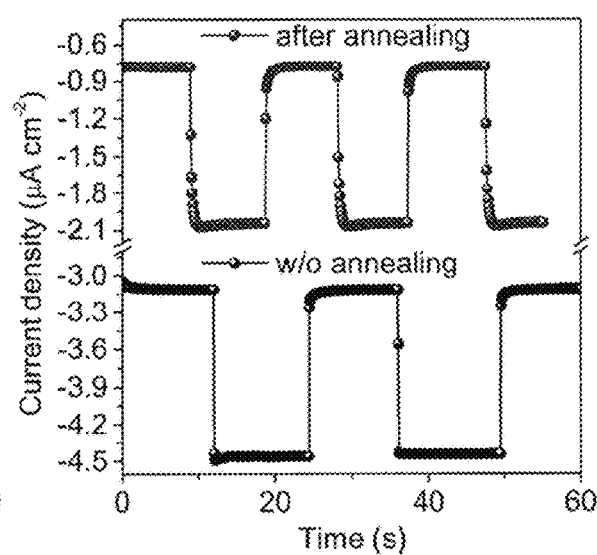
FIG. 18B shows dark current and photocurrent stability of $MAPbBr_{3-x}Cl_x$ single crystal devices with and without annealing treatment.

It was also found that the dark current of MAPbBr$_3$ single crystal device and MAPbBr$_{3-x}$Cl$_x$ single crystal device were both significantly reduced after thermal annealing at 250° C. for 20 minutes as shown in FIG. 18. There was twice reduction of dark current for MAPbBr$_3$ single crystal device, while there was about 3.5 times reduction of dark current for MAPbBr$_{3-x}$Cl$_x$ single crystal device. In addition, the reduction of dark current didn't sacrifice the photocurrent signal, and there is almost no change of the signal current after annealing.

Figure 15E:
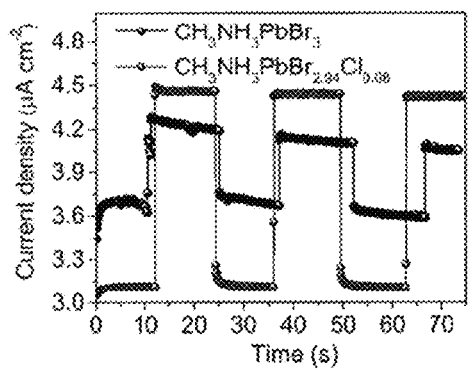
FIG. 15E shows dark current and photocurrent stability of CH$_3$NH$_3$PbBr$_3$ single crystal device and CH$_3$NH$_3$PbBr$_{2.94}$Cl$_{0.06}$ single crystal device under electrical field of 0.11 V μm$^{-1}$.
Figure 15F:
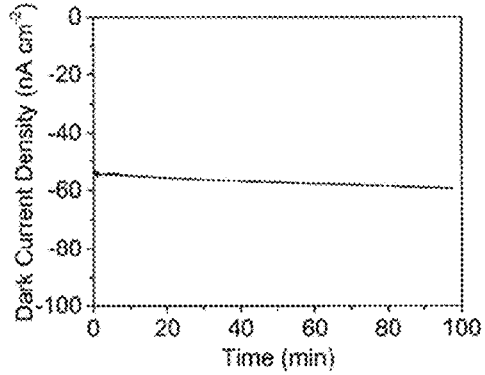
FIG. 15F shows long term dark current stability of CH$_3$NH$_3$PbBr$_{2.94}$Cl$_{0.06}$ single crystal device under electrical field of 1.8 V mm$^{-1}$.

Cesium-137 ($^{137}$Cs) spectrum from a γ-ray detector with a guard ring electrode One concern for the application of OIHP materials for radiation detection is the polarization effect due to ion migration which results in a shift of the energy spectrum as well as a degradation of resolution. Furthermore, ion migration in OIHP polycrystalline films has been known to result in a switchable photovoltaic effect as well as be an origin of the current hysteresis phenomenon in OIHP devices. Despite the ion migration through grain interiors, it was revealed that grain boundaries in polycrystalline films proved to be faster ion migration channels. Therefore, the absence of grain boundaries in high quality single crystals should suppress the polarization effect. Ultimately, a small drift of both the dark current and photocurrent was observed for the control $CH_3NH_3PbBr_3$ single crystal device under an applied electric field of 0.11 V $\mu m^{-1}$ (FIG. 15E), which may be caused by ion migration along the crystal surface or possibly by charge trapping/detrapping effects. The $CH_3NH_3PbBr_{2.94}Cl_{0.06}$ single crystal device demonstrated enhanced stability for both the dark current and photocurrent under the same electric field. In practice, the excellent charge collection efficiency and response speed enable our detector to work under a low electric field of 1.8 V $mm^{-1}$, which should retain the stability of dark current. The dark current was continuously monitored under the electric field of 1.8 V $mm^{-1}$ for about 100 minutes, and it was found that the dark current only drifted ~5 nA $cm^{-2}$, or 8% of the dark current (FIG. 15F). The increased stability may be attributed to the increased attraction forces between the cation-anion pair of the $Cl^-$ anions as compared to the $Br^-$ anions. The increased attraction would in effect suppress ion migration through the crystal surface, agreeing with the reduced trap density measured.

Figure 16A:
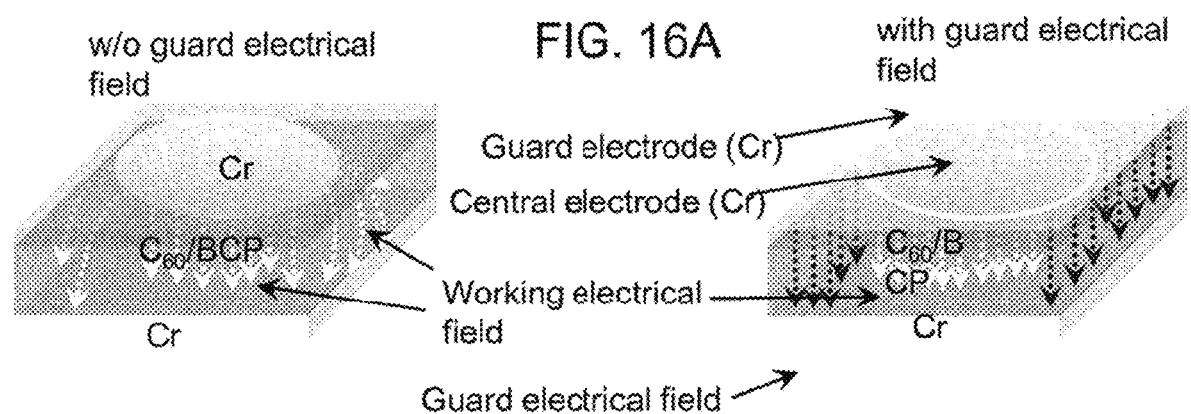
FIG. 16A shows electrical field distribution of a single crystal device with guard electrode, and the effective working electrical field is protected by the guard electrical field; surface leakage current is excluded.
Figure 16B:
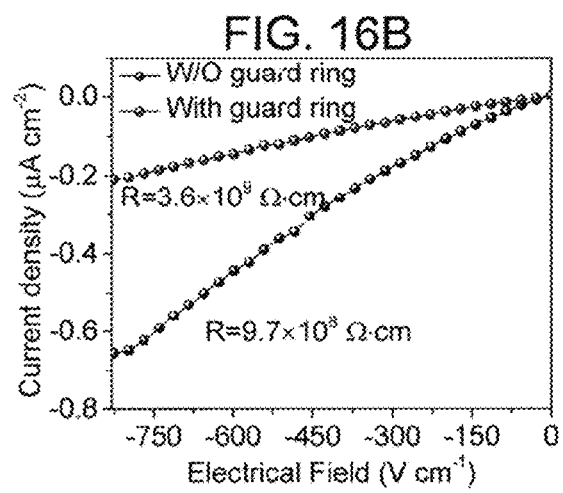
FIG. 16B shows dark current density of a MAPbBr$_3$ single crystal device with and without guard electrical field protection.

Despite the reduction of polarization effects, the $CH_3NH_3PbBr_{2.94}Cl_{0.06}$ single crystals maintain several defects on the crystal surface, resulting in a significant surface leakage current. Such leakage current is only notable when the bulk resistivity of the crystal is very large so that the bulk leakage current is comparable or smaller. To mitigate the leakage current, a guard ring electrode was employed around the central cathode as illustrated in FIG. 16A. Separating the central cathode and the guard electrode is a channel (e.g., with a width of 50 μm). The magnitude of the electric field is common but individually decoupled with respect to the guard electrode—anode and central cathode—anode pairing. In this way, the surface/edge leakage current is absorbed by the outer guard electrode while the main signal is produced from flow of inner bulk charges. FIG. 16B demonstrates the resulting fourfold suppression of the dark current from the guard ring electrode device. The intrinsic resistivity of the $CH_3NH_3PbBr_{2.94}Cl_{0.06}$ single crystal reaches $3.6 \times 10^9$ Ω cm, comparable to the state-of-the-art CdZnTe (CZT) materials. The high resistivity results from the low charge carrier concentration of the single crystal. A tenfold reduction in bulk carrier concentration was observed for the $CH_3NH_3PbBr_{2.94}Cl_{0.06}$ single crystal compared to the control $CH_3NH_3PbBr_3$ single crystal by taking the mobility change after dopant compensation into consideration, as shown in FIG. 13A (details of calculation are presented in Table 1).

Figure 16C:
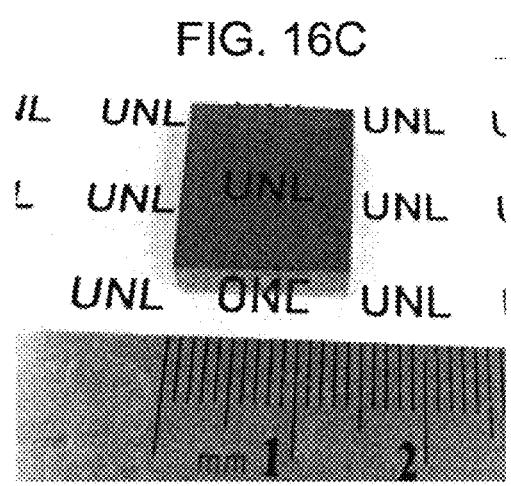
FIG. 16C shows photograph of a centimeter-sized CH$_3$NH$_3$PbBr$_{2.94}$Cl$_{0.06}$ single crystal for $^{137}$Cs energy spectrum with dimension of 1.44×1.37×0.58 cm$^3$.
Figure 16D:
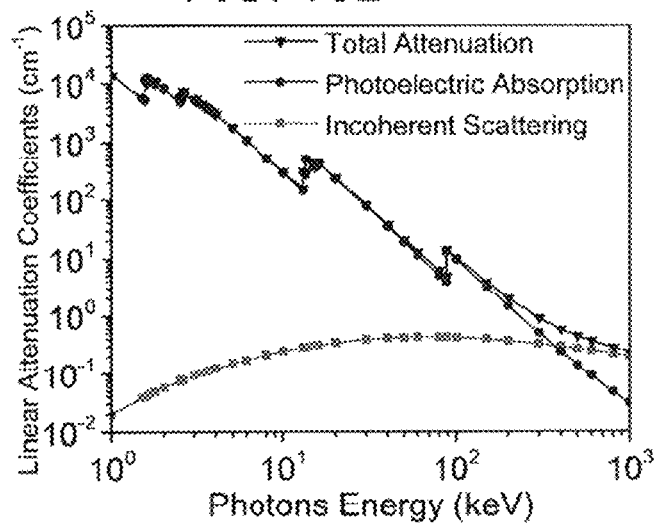
FIG. 16D shows linear attenuation coefficients of $CH_3NH_3PbBr_{2.94}Cl_{0.06}$ perovskite versus different photon energy.
Figure 16E:
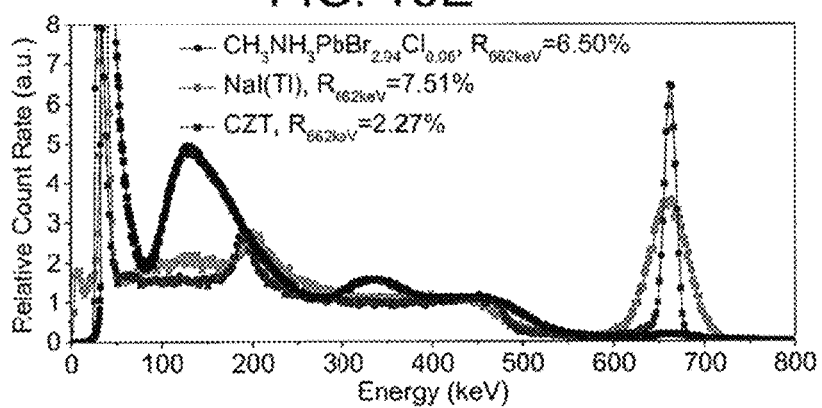
FIG. 16E shows $^{137}Cs$ energy spectrum obtained by $CH_3NH_3PbBr_{2.94}Cl_{0.06}$ single crystal, CZT and NaI(Tl) detectors, normalized relative to Compton's edge (478 keV).
Figure 16F:
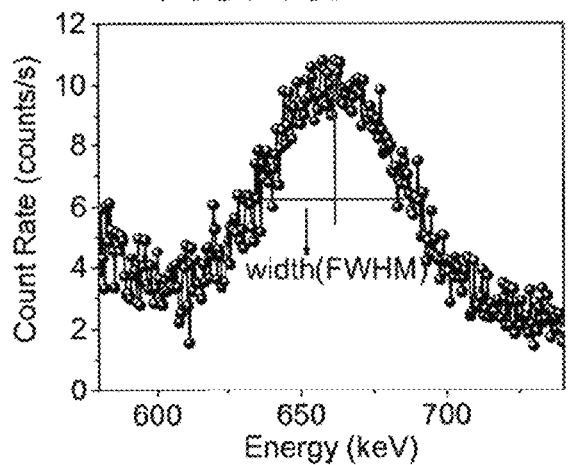
FIG. 16F shows enlarge image of the $^{137}Cs$ energy spectrum around 662 keV range obtained by $CH_3NH_3PbBr_{2.94}Cl_{0.06}$ single crystal, indicating a resolution of 6.50%.
Figure 17A:
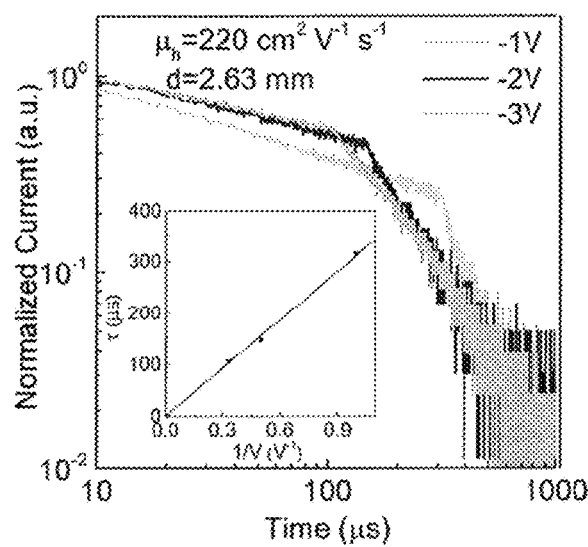
FIG. 17A shows the hole mobility of $CH_3NH_3PbBr_{3-x}Cl_x$ SC with 0% Cl.
Figure 17B:
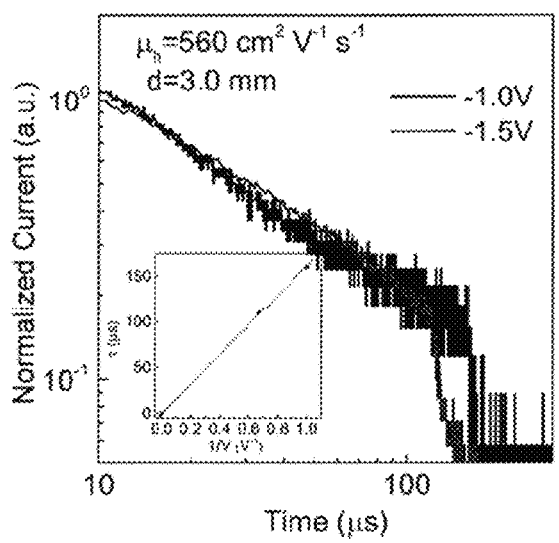
FIG. 17B shows the hole mobility of $CH_3NH_3PbBr_{3-x}Cl_x$ SC with 2% Cl.
Figure 17C:
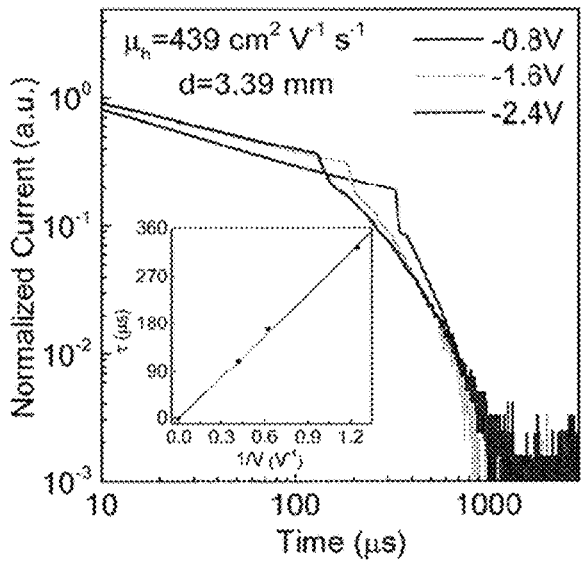
FIG. 17C shows the hole mobility of $CH_3NH_3PbBr_{3-x}Cl_x$ SC with 5% Cl.
Figure 17D:
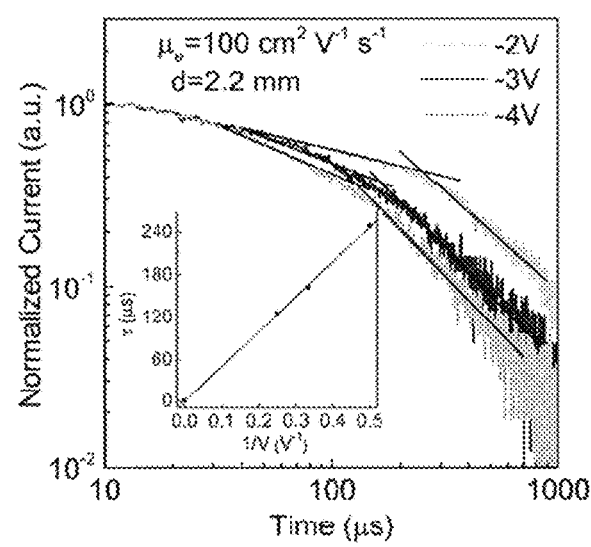
FIG. 17D shows the electron mobility of $CH_3NH_3PbBr_{3-x}Cl_x$ SC with 0% Cl.
Figure 17E:
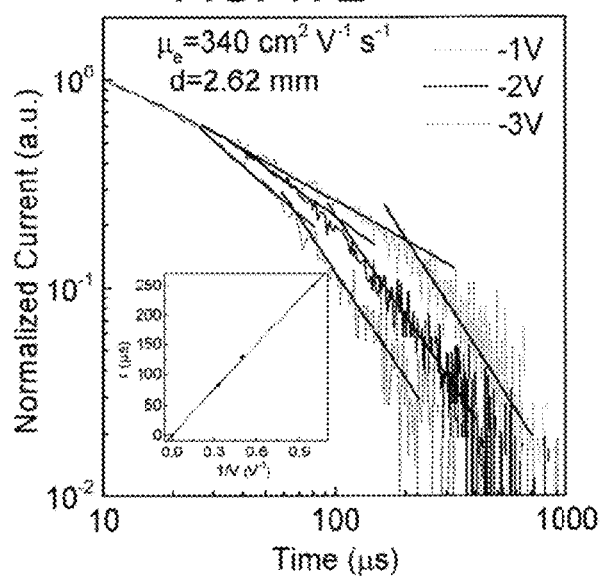
FIG. 17E shows the electron mobility of $CH_3NH_3PbBr_{3-x}Cl_x$ SC with 2% Cl.
Figure 17F:
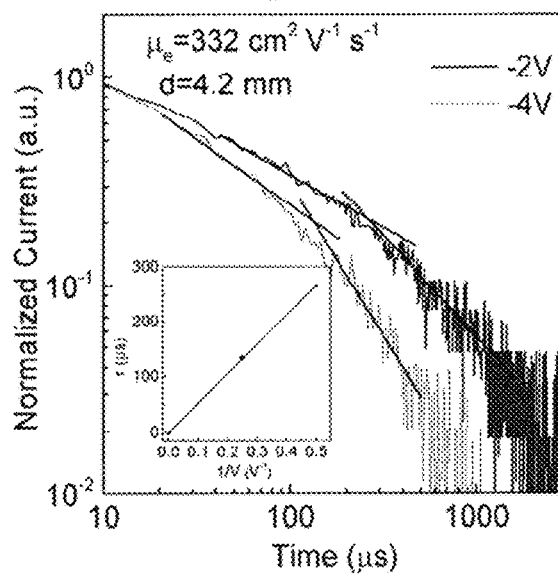
FIG. 17F shows the electron mobility of $CH_3NH_3PbBr_{3-x}Cl_x$ SC with 5% Cl.

Utilizing the aforementioned enhancements, the $^{137}Cs$ energy spectrum was obtained with a $CH_3NH_3PbBr_{2.94}Cl_{0.06}$ single crystal, having dimensions of $1.44 \times 1.37 \times 0.58$ $cm^3$ (FIG. 16C), device with a guard ring electrode. A 5.0 μCi $^{137}Cs$ source was placed 10 cm from the anode of the $CH_3NH_3PbBr_{2.94}Cl_{0.06}$ detector, which was connected to a charge sensitive preamplifier (Ortec-142A). A CZT semiconductor and NaI(Tl) scintillator were used as reference detectors. The $^{137}Cs$ energy spectrum was recorded by the $CH_3NH_3PbBr_{2.94}Cl_{0.06}$ detector under an electric field of 1.8 V/mm at room temperature as shown in FIG. 16E. The resulting spectrum of the full energy peak produced by $CH_3NH_3PbBr_{2.94}Cl_{0.06}$ is presented in FIG. 16F. The count rate is normalized relative to Compton's edge for a better comparison of spectrum features between detectors of varying efficiencies. The resolutions of the full energy peak are 2.27%, 6.50%, and 7.51% for CZT, $CH_3NH_3PbBr_{2.94}Cl_{0.06}$, and NaI(T1), respectively. As can be seen in FIG. 16E, the peak to Compton ratio is much lower for perovskite than that of the other detectors, which is largely owing to its small size and partially due to the small electric field resulting in a long photoelectron transit-time of 50 μs as compared to the charge carrier recombination lifetime of about 32 μs. Nevertheless, perovskite demonstrates desirable material properties for gamma spectroscopy, for instance it's ratio of photoelectric to total cross section, $$\frac{\sigma_{pe}}{\sigma_{tot}},$$

of 0.24 at 662 keV. The large peak which extends from 80 keV to 280 keV is considered as the combination of the backscattering peak due to the thick aluminum walling of the chamber, in which the perovskite was housed during testing, as well as the detector's response to the source's β-particles (mean energy at 187 keV) since the detector was directly exposed to the source without any encapsulating layers. A peak at 330 keV is only observed in the perovskite spectrum. The origin of this peak is not fully understood, although it could be the sum peak of the backscatter as it is the prevalent contributor to the gross counts. Therefore, it is shown that perovskite is capable of obtaining resolutions higher than those obtained through NaI(Tl) scintillator detectors while being more economical than standard semiconductor detectors used in industry. Moreover, the ability to grow high quality perovskite crystals up to and larger than 1.4 cm provides the potential for increased efficiency/cost ratio which limits other semiconductor detectors such as CZT.

EXAMPLE METHODS AND CHARACTERIZATIONS FOR $MAPbBr_{3-x}Cl_x$ SCs

Materials. Lead bromide ($PbBr_2$) (>98%, Sigma-Aldrich), Lead chloride ($PbCl_2$) (>98%, Sigma-Aldrich), Methylamine ($CH_3NH_2$) (40% w/w aq. soln., Alfa Aesar), Hydrobromic acid (HBr) (48% w/w aq. soln., Alfa Aesar), Hydrochloric acid (HCl) (36.5 wt % in water, Alfa Aesar), $C_{60}$ (>99.5%, Nano-C), Bathocuproine (BCP) (>96%, Sigma-Aldrich), N,N-Dimethylformamide (DMF) (>99.8%, Alfa Aesar), Dichloromethane (DCM) (99.7%, Alfa Aesar).

Synthesis of Methylammonium Bromide (MABr). MABr was prepared by slowly mixing methylamine with HBr in 1:1 molar ratio under continuous stirring at 0° C. for 2 h. MABr was then crystallized by removing the solvent from an evaporator, washing three times in diethyl ether, and filtering the precipitate. The white crystal was obtained by recrystallization with ethanol, then dried in vacuum for 24 h, and kept in a dark and dry environment for further use.

Synthesis of Methylammonium chloride (MACl). MACl was synthesized by the reaction of methyl-amine (13.5 mL) with a concentrated aqueous solution of hydrochloric acid (23.5 mL) at 0° C. for 2 h with constant stirring, followed by a crystallized purification and dry process Growth of $MAPbBr_3$ single crystal (SC). 0.64 M $PbBr_2$ and 0.8 M MABr were dissolved into 5 ml DMF solution in a 20 ml vial to keep the molar ratio of $PbBr_2$ to MABr is 0.8. Then the vial was sealed with foil, and was stored in the atmosphere of DCM, but leaving a small hole to let DCM slowly get in. DCM was employed as anti-solvent to precipitate the SCs. Finally, MAPbBr$_3$ SC can slowly grow big in two days.

Growth of MAPbCl$_3$ single crystal. 1M MAPbCl$_3$ solution in DMSO-DMF (1:1 by volume) was prepared by dissolving equimolar amounts of MAC1 and PbCl$_2$. The solution was then filtered using a PTFE filter. We grew single crystals from this solution by gradually increase the temperature.

Growth of MAPbBr$_{3-x}$Cl$_x$ single crystal. MAPbBr$_{3-x}$Cl$_x$ single crystals were grown either by anti-solvent method or inverse temperature crystalline method. For inverse temperature crystalline method: 1.5 M PbBr$_2$ and 1.5 M MABr were dissolved into DMF solution in a vial to get MAPbBr$_3$ solution, and MAPbCl$_3$ single crystal with different amount (2.0% or 5.1%, mol %) was dissolved into this solution under long term stirring. Then the solution was heated on a hot plate. Finally, MAPbBr$_{3-x}$Cl$_x$ SC can slowly grow by gradually increasing the temperature of the hot plate; For anti-solvent method: 1 M PbBr$_2$ and 1 M MABr were dissolved into DMF solution in a vial to get MAPbBr$_3$ solution, and MAPbCl$_3$ single crystal with different amount (2.0% or 5.1%, mol %) was dissolved into this solution under long term stirring. Then the vial was sealed by aluminum foil but leave a small hole, and the vial was stored under DCM atmosphere. Finally, MAPbBr$_{3-x}$Cl$_x$ SC can slowly grow big in several days.

Device fabrication. An anode material is deposited on the top surface of the SC (e.g., 20 nm Cr as anode), then on the bottom surface, electrons-transporting layers are constructed by depositing e.g., 20 nm C$_{60}$ and 8 nm BCP. Finally, a semi-transparent cathode (e.g.,20 nm Cr) is deposited using a thermal evaporation system through a shadow mask under high vacuum. Device area varies from 4 to 16 mm$^2$ according to size of SC.

U.S. application Ser. No. 14/576,878, filed Dec. 19, 2014, entitled "Photovoltaic Perovskite Material and Method of Fabrication," and U.S. application Ser. No. 15/009,701, filed Jan. 28, 2016, entitled "Systems and Methods for Fabricating Single Crystal Photovoltaic Perovskite materials and Devices Incorporating the Same," provide additional details regarding various device materials, structures and fabrication processes and are both hereby incorporated by reference herein for all purposes.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the disclosed subject matter (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or example language (e.g., "such as") provided herein, is intended merely to better illuminate the disclosed subject matter and does not pose a limitation on the scope of the invention unless otherwise claimed. No language in the specification should be construed as indicating any non-claimed element as essential to the practice of the invention.

Certain embodiments are described herein. Variations of those embodiments may become apparent to those of ordinary skill in the art upon reading the foregoing description. The inventors expect skilled artisans to employ such variations as appropriate, and the inventors intend for the embodiments to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

The invention claimed is:

1. A perovskite single crystal X-ray and gamma-ray radiation detector device, comprising:
   an X-ray and gamma-ray wavelength responsive active layer including a perovskite single crystal;
   a first electrode disposed on a first surface of the perovskite single crystal; and
   a second electrode disposed on the first surface or on a second surface of the perovskite single crystal opposite the first surface;
   wherein the perovskite single crystal is a perovskite single crystal having a structure of APbBr$_{3-x}$Cl$_x$, wherein A is methylammonium (CH$_3$NH$_3$+) and
   wherein x is a fractional number between 0 and 0.6.

2. The device of claim 1, wherein a thickness of the perovskite single crystal is between about 0.01 mm and about 100 mm.

3. The device of claim 1, wherein perovskite single crystal is responsive to photons having energy in the range of about 1 eV to about 10 MeV.

4. The device of claim 1, wherein the perovskite single crystal includes a MAPbBr$_3$ single crystal, and wherein the MAPbBr$_3$ single crystal is synthesized with a ratio of PbBr$_2$:MABr around 0.8 in a precursor solution, wherein MA is methylammonium (CH$_3$NH$_3$+).

5. The device of claim 1, wherein the first and second electrodes each comprise C$_{60}$, BCP, gold, silver, aluminum, gallium, chromium, or copper.

6. The device of claim 1, wherein perovskite structure includes a MAPbBr$_{3-x}$Cl$_x$ structure formed by incorporating n-type MAPbCl$_3$ into p-type MAPbBr$_3$.

7. A method of improving the sensitivity or signal-to-noise ratio of a perovskite single crystal device, the method comprising:
   incorporating Y ions into a perovskite single crystal having a structure of ABX$_3$, where the Y ions include one kind of ion or many kinds of ions together, and wherein A is methylammonium (CH$_3$NH$_3$+), Cs+, formamidinum (H$_2$NCHNH$_2$+), or Rb+ or a mixture thereof, wherein B is Pb$^{2+}$, Bi$^{3+}$, Sb$^{3+}$, or Sn$^{2+}$ or a mixture thereof, and X is a halide anion(s), thiocyanate (SCN-) or a mixture thereof;

wherein the resulting perovskite single crystal is a perovskite single crystal having a structure of $MABI_{3-x-y-z}Br_xCl_ySCN_z$, wherein MA is methylammonium ($CH_3NH_3^+$), $Cs^+$, formamidinum ($H_2NCHNH_2^+$), or $Rb^+$ or a mixture thereof, B is $Pb^{2+}$, $Bi^{3+}$, $Sb^{3+}$, or $Sn^{2+}$ or a mixture thereof, and wherein x, y and z are each fractional numbers between, and including, 0 and 3.

8. The method of claim 7, wherein a thickness of the perovskite single crystal structure is between about 0.01 mm and about 100 mm.

9. The method of claim 7, further comprising applying a treatment to a top surface of the single crystal that results in a suppression of a leakage current of the single crystal device.

10. The method of claim 9, wherein the treatment includes an oxidation treatment or thermal annealing of the single crystal under a temperature of between about 20° C. and about 3000° C.

11. The method of claim 7, wherein the perovskite single crystal is a perovskite single crystal having a structure of $MABI_{3-x-y-z}Br_xCl_ySCN_z$, wherein MA is methylammonium ($CH_3NH_3^+$), $Cs^+$, formamidinum ($H_2NCHNH_2^+$), or $Rb^+$ or a mixture thereof, B is $Pb^{2+}$, $Bi^{3+}$, $Sb^{3+}$, or $Sn^{2+}$ or a mixture thereof, and wherein x, y and z are each fractional numbers between 0 and 3.

12. A perovskite single crystal X-ray and gamma-ray radiation detector device, comprising:

an X-ray and gamma-ray wavelength responsive active layer including a perovskite single crystal;

a first electrode disposed on a first surface of the perovskite single crystal; and a second electrode disposed on the first surface or on a second surface of the perovskite single crystal opposite the first surface;

wherein the perovskite single crystal is a perovskite single crystal having a structure of $MABI_{3-x-y-z}Br_xCl_ySCN_z$, wherein MA is methylammonium ($CH_3NH_3^+$), $Cs^+$, formamidinum ($H_2NCHNH_2^+$), or $Rb^+$ or a mixture thereof, B is $Pb^{2+}$, $Bi^{3+}$, $Sb^{3+}$, or $Sn^{2+}$ or a mixture thereof, and wherein x, y and z are each fractional numbers between, and including, 0 and 3.

13. The method of claim 12, wherein the perovskite single crystal is a perovskite single crystal having a structure of $MABI_{3-x-y-z}Br_xCl_ySCN_z$, wherein MA is methylammonium ($CH_3NH_3^+$), $Cs^+$, formamidinum ($H_2NCHNH_2^+$), or $Rb^+$ or a mixture thereof, B is $Pb^{2+}$, $Bi^{3+}$, $Sb^{3+}$, or $Sn^{2+}$ or a mixture thereof, and wherein x, y and z are each fractional numbers between 0 and 3.

14. The device of claim 12, wherein perovskite structure includes a $MAPbBr_{3-x}Cl_x$ structure formed by incorporating n-type $MAPbCl_3$ into p-type $MAPbBr_3$.

* * * * *